United States Patent
Hellberg

(10) Patent No.: US 9,768,735 B2
(45) Date of Patent: Sep. 19, 2017

(54) AMPLIFIER CIRCUIT AND METHOD

(71) Applicant: Telefonaktiebolaget L M Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/899,703

(22) PCT Filed: Jun. 28, 2013

(86) PCT No.: PCT/EP2013/063728
§ 371 (c)(1),
(2) Date: Dec. 18, 2015

(87) PCT Pub. No.: WO2014/206501
PCT Pub. Date: Dec. 31, 2014

(65) Prior Publication Data
US 2016/0142021 A1 May 19, 2016

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/0294* (2013.01); *H03F 3/19* (2013.01);
(Continued)

(58) Field of Classification Search
CPC . H03F 1/07; H03F 1/0288; H03F 3/68; H03F 1/3252; H03F 1/06; H03F 3/24; H03F 3/60
(Continued)

(56) References Cited

U.S. PATENT DOCUMENTS 6,472,934 B1  10/2002  Pehlke
8,022,760 B2   9/2011  Gajadharsing et al.
(Continued)

FOREIGN PATENT DOCUMENTS

EP   2 403 135 A1   1/2012
EP   2 568 598 A1   3/2013
(Continued)

OTHER PUBLICATIONS

International Search Report issued in corresponding International application No. PCT/EP2013/063728, date of completion of the International Search Jan. 16, 2014.
(Continued)

*Primary Examiner* — Steven J Mottola
*Assistant Examiner* — Hafizur Rahman
(74) *Attorney, Agent, or Firm* — Patent Portfolio Builders PLLC

(57) ABSTRACT

An amplifier arrangement comprises N amplifier stages ($10_1$ to $10_N$), wherein N is an integer equal or greater than four. The amplifier arrangement comprises a cascade of quarter wavelength transmission lines coupled between an output of an amplifier of a first amplifier stage ($10_1$) and an output node (15) of the amplifier arrangement, wherein the cascade comprises N-1 quarter wavelength transmission lines ($11_1$ to $11_{N-1}$). An amplifier of the Nth stage ($10_N$) is coupled to the output node (15), and remaining amplifiers between the first and Nth stages ($10_2$ to $10_{N-1}$) coupled to successive junctions in the cascade of quarter wavelength transmission lines ($11_1$ to $11_{N-1}$). The amplifier arrangement is further configured such that apart from first and second amplifiers ($10_1$ and $10_2$) coupled to first and second junctions of the cascade of quarter wavelength transmission lines, the remaining amplifiers ($10_3$ to $10_N$) are coupled to their respective junctions of the cascade of quarter wavelength
(Continued)

transmission lines such that successive pairs of amplifiers are either coupled via respective connecting quarter wavelength transmission lines (13) to their respective junctions, or coupled directly to their respective junctions.

20 Claims, 33 Drawing Sheets

(51) Int. Cl.
  *H03F 3/195* (2006.01)
  *H03F 3/24* (2006.01)
  *H03F 3/60* (2006.01)
  *H03F 3/19* (2006.01)
  *H03F 3/21* (2006.01)
  *H01P 5/12* (2006.01)

(52) U.S. Cl.
  CPC .............. *H03F 3/195* (2013.01); *H03F 3/211* (2013.01); *H03F 3/245* (2013.01); *H03F 3/602* (2013.01); *H01P 5/12* (2013.01); *H03F 2200/451* (2013.01); *H03F 2203/21106* (2013.01)

(58) Field of Classification Search
  USPC ......... 330/10, 84, 86, 124 R, 126, 129, 130, 330/207 D, 251, 295, 207 A; 332/103, 332/145; 333/117, 122, 124, 204, 205, 333/219, 248; 379/338, 443; 455/127.1, 455/143
  See application file for complete search history.

(56) References Cited

U.S. PATENT DOCUMENTS

| | | | | |
|---|---|---|---|---|
| 8,653,889 | B1* | 2/2014 | Acimovic | H03F 1/0288 330/124 R |
| 2006/0145757 | A1* | 7/2006 | Kim | H03F 1/0288 330/124 R |
| 2013/0181773 | A1* | 7/2013 | Liu | H03F 3/68 330/124 R |
| 2014/0320214 | A1* | 10/2014 | Liu | H03F 1/0288 330/295 |

FOREIGN PATENT DOCUMENTS

| | | |
|---|---|---|
| EP | 2 608 400 A1 | 6/2013 |
| WO | 2014/206502 A1 | 12/2014 |

OTHER PUBLICATIONS

Written Opinion of the International Searching Authority issued in International application No. PCT/EP2013/063728, date of mailing Jan. 24, 2014.

Doherty, W. H., "A New High Efficiency Power Amplifier for Modulated Wave," Proceedings of the Institute of Radio Engineers, vol. 24, No. 9, Sep. 1956.

Raab, Frederick H., "Efficiency of Doherty RF Power-Amplifier Systems," IEEE Transactions on Broadcasting, vol. BC-33, No. 3, Sep. 1987.

* cited by examiner

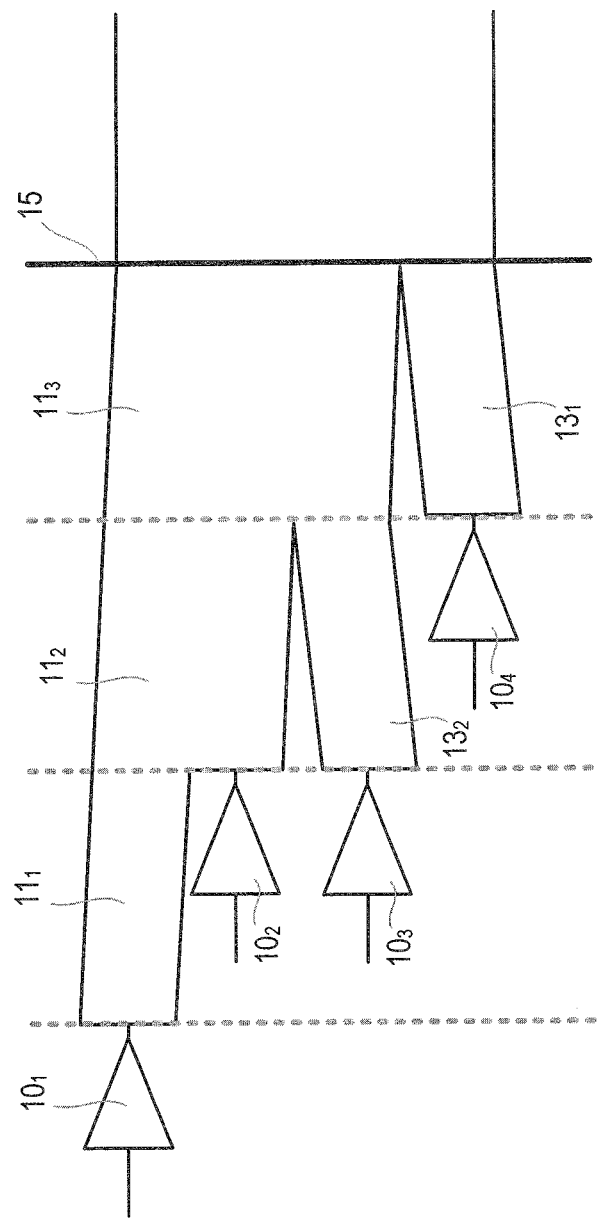

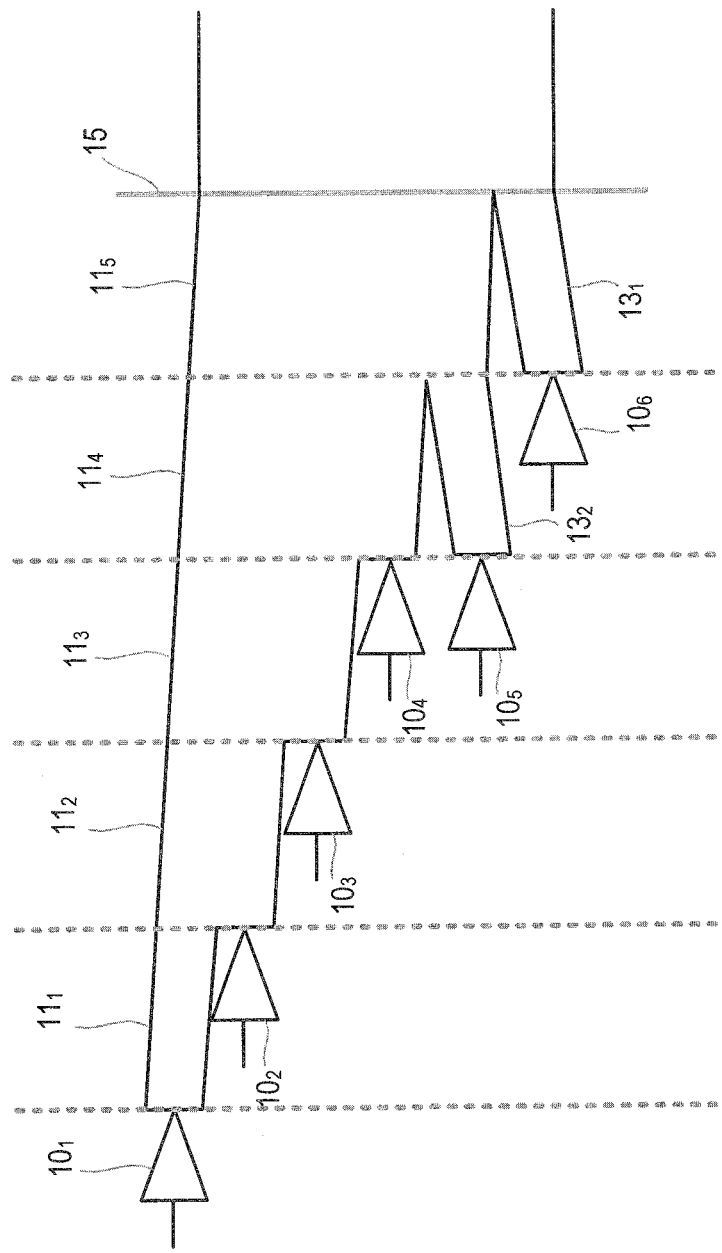

Output amplitude

Current (I)

Voltage (v)

Efficiency (η)

Output amplitude

AMPLIFIER CIRCUIT AND METHOD

TECHNICAL FIELD

The present invention relates generally to an amplifier circuit and method, and more particularly to an amplifier circuit and method which provides improved efficiency, for example an amplifier circuit comprising multi stages of amplifiers configured to operate in Chireix and Doherty modes of operation.

BACKGROUND

Power amplifiers are often used to amplify wideband signals or signal combinations with high peak to average power ratio, PAR. The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

It is known to have power amplifiers configured to operate in a Doherty mode or a Chireix mode of operation, based on multiple transistors with passive output network interaction and combination. Such power amplifiers are much more efficient than conventional amplifiers for amplitude-modulated signals that have a high peak-to-average ratio (PAR), since they have a much lower average sum of output currents from the amplifier transistors. It will be appreciated that such a reduced average output current leads to high average efficiency. This high average efficiency is because the DC currents drawn by the transistors are largely proportional to the RF current magnitudes. An example of a Doherty amplifier is described in "A new high efficiency power amplifier for modulated waves,", W. H. Doherty, Proc. IRE, vol. 24, no. 9, pp. 1163-1182, September 1936.

Reduced RF output currents are obtained by having high transimpedance from at least one transistor to the output, while having the possibility of in-phase combining all transistor outputs to obtain full output power. Higher transimpedance means higher voltage at the output for the same amount of current. This is achieved in the Doherty amplifier by having the main transistor ("carrier amplifier") displaced from the output node by a quarter wavelength transmission line of characteristic impedance Ropt. (A transistor's Ropt is the optimal load resistance for achieving maximum output power).

Since the load Rload has a lower value than Ropt (typically Rload=Ropt/2) this line acts as a quarterwave transformer. The transimpedance to the output from the main transistor is equal to the characteristic impedance of the quarterwave line (i.e. Ropt), instead of Rload as would be the case for one transistor coupled directly to the load. The self-impedance at the main transistor is increased quadratically to the characteristic impedance squared divided by Rload (aka "impedance inversion" of the load). If the peak transistor ("auxiliary amplifier", "peaking amplifier") has an Ropt that in parallel combination with the Ropt of the main transistor gives Rload, full combined output power will be possible by in-phase combining (i.e. adjusting the phase (time, electrical length) difference between the main and peak drive signals so the output waves from both are in phase at the output Rload).

The carrier amplifier output current is linear in amplitude, i.e. follows the desired output signal. The peaking amplifier output current is zero for low amplitudes, and rises (piecewise) linearly from the transition point. The transition point for a 2-stage Doherty designed for two equal size transistors is at half the maximum output amplitude. The shaping of the output RF current amplitude is in some cases done by biasing the gate low and increasing the RF drive voltage, known as class C operation. This shaping can also be done, wholly or partially, earlier in the processing chain, by analog or digital signal shaping circuits.

The first way to extend the Doherty amplifier to more stages (transistors, constituent amplifiers) was shown by F. H. Raab in a paper entitled "Efficiency of Doherty RF Power Amplifier Systems", IEEE Trans. Broadcasting, vol. BC-33, no. 3, pp. 77-83, September 1987. These amplifiers can be described as having a cascade of quarterwave transmission lines with successively lower characteristic impedance towards the output (load), where RF transistors are connected at the junctions between the transmission lines. The resulting amplifier makes it possible to have high efficiency in a wider range of back off.

U.S. Pat. No. 8,022,760 discloses an alternative arrangement for 3-transistor Doherty amplifiers, whose main benefit is better placement of the transition points (corresponding to high points in the efficiency vs. amplitude curve) for equal-sized transistors. Higher order versions of the 3-transistor Doherty amplifier in U.S. Pat. No. 8,022,760 consist of having a higher order quarterwave cascade multistage Doherty as a peaking amplifier. Only the ones with an odd total number, N, of transistors (5, 7, 9 etc. . . . ) work, i.e. those that have quarterwave cascades with an even number, N−1, of quarterwave lines.

EP2,403,135 discloses a four-transistor Doherty amplifier. This is basically the 3-stage amplifier of U.S. Pat. No. 8,022,760 with an added peaking amplifier at the output node and has largely the same advantages as U.S. Pat. No. 8,022,760 regarding transistor sizes. Higher order versions of EP2,403,135 consist of even numbers, N, of transistors, with both a directly connected and a quarterwave-connected transistor at the output node. The quarterwave cascade in the peaking amplifier branch will therefore have the total length, N−2, i.e. the same lengths as for the amplifiers in U.S. Pat. No. 8,022,760.

Co-pending patent application P39991WO by the present applicant describes a class of multistage Doherty amplifiers with several improved properties over the prior art described above, and a regular structure.

The multistage Doherty amplifiers by Raab generally have their transition points too high to give good average efficiency with high-PAR signals if the transistor stages are of equal size. FIGS. 1a, 1b and 1c show the curves for a 5-stage implementation, in which the lowest transition point is at 0.37 of full output. The amplifiers with higher numbers of stages generally have the same problem, and even with access to a small number of different transistor sizes.

The requirement for several different amplitude-limited drive signals can pose problems is some implementation technologies.

Referring to the graphs of FIGS. 2a, 2b, and 2c, the 5-stage amplifier of U.S. Pat. No. 8,022,760 has an advantage over the Raab type amplifier described in FIGS. 1a, 1b and 1c for use with high-PAR signals, since the lowest transition point with five equal size transistors is at 0.2 of full output amplitude (−14 dB). However, it has a sparse distribution of transition points at low amplitude, and requires two different amplitude-limited drive signals.

For six and higher numbers of stages, implementations with equal size transistors of U.S. Pat. No. 8,022,760 and EP2,403,135 all suffer from too sparse transition points at low output amplitudes, as illustrated by FIGS. 3a, 3b and 3c for a 6-stage arrangement according to EP2,403,135, and FIGS. 4a, 4b and 4c for a 7-stage arrangement according to U.S. Pat. No. 8,022,760.

Each of the amplifier arrangements described in FIGS. 3 and 4 require several (N−3) different amplitude-limited drive signals.

SUMMARY

It is an aim of the present invention to provide a method and apparatus which obviate or reduce at least one or more of the disadvantages mentioned above.

According to a first aspect of the present invention there is provided an amplifier arrangement comprising N amplifier stages, wherein N is an integer equal or greater than five. The amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines. An amplifier of the Nth stage is coupled to the output node, and remaining amplifiers between the first and Nth stages coupled to successive junctions in the cascade of quarter wavelength transmission lines. The amplifier arrangement is further configured such that first and second amplifiers of the first and second stages are coupled directly to respective junctions of the cascade of quarter wavelength transmission lines, and remaining amplifiers of the third to Nth stages are coupled to their respective junctions of the cascade of quarter wavelength transmission lines such that successive pairs of amplifiers are either coupled via respective connecting quarter wavelength transmission lines to their respective junctions, or coupled directly to their respective junctions. An advantage of this arrangement is that it provides good efficiency for high PAR signals even with equal size transistors, due to a high density of transition points at low output amplitudes, as will be explained later in the application.

According to another aspect of the present invention there is provided a method of improving the efficiency of an amplifier arrangement comprising N amplifier stages, wherein N is an integer equal or greater than five; wherein the amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines, and wherein an amplifier of the Nth stage is coupled to the output node, and remaining amplifiers between the first and Nth stages coupled to successive junctions in the cascade of quarter wavelength transmission lines. The method comprises the steps of coupling first and second amplifiers of the first and second stages to respective first and second junctions of the cascade of quarter wavelength transmission lines, and coupling the remaining amplifiers to their respective junctions of the cascade of quarter wavelength transmission lines such that successive pairs of amplifiers are either coupled via respective connecting quarter wavelength transmission lines to their respective junctions, or coupled directly to their respective junctions.

BRIEF DESCRIPTION OF THE DRAWINGS

For a better understanding of the present invention, and to show more clearly how it may be carried into effect, reference will now be made, by way of example only, to the following drawings in which:

FIG. 5a shows an amplifier arrangement according to a co-pending application by the present applicant;

FIGS. 5b to 5d show current, voltage and efficiency curves for the amplifier arrangement of FIG. 5a;

FIG. 5e shows a schematic diagram of the amplifier arrangement according to FIG. 5a;

FIGS. 7b to 7d show current, voltage and efficiency curves for the amplifier arrangement of FIG. 7a;

FIG. 8a shows an amplifier arrangement according to an embodiment of the present invention;

FIGS. 8b to 8d show current, voltage and efficiency curves for the amplifier arrangement of FIG. 8a;

FIGS. 9b to 9d show current, voltage and efficiency curves for the amplifier arrangement of FIG. 9a;

FIGS. 11b to 11d show current, voltage and efficiency curves for the amplifier arrangement of FIG. 11a;

FIGS. 12b to 12d show current, voltage and efficiency curves for the amplifier arrangement of FIG. 12a;

FIGS. 13b to 13d show current, voltage and efficiency curves for the amplifier arrangement of FIG. 13a;

FIGS. 14b to 14d show current, voltage and efficiency curves for the amplifier arrangement of FIG. 14a;

FIGS. 15b to 15d show current, voltage and efficiency curves for the amplifier arrangement of FIG. 15a;

FIGS. 16b to 16d show current, voltage and efficiency curves for the amplifier arrangement of FIG. 16a;

FIGS. 17b to 17d show current, voltage and efficiency curves for the amplifier arrangement of FIG. 17a;

FIGS. 18b to 18d show current, voltage and efficiency curves for the amplifier arrangement of FIG. 18a;

FIGS. 19b to 19d show current, voltage and efficiency curves for the amplifier arrangement of FIG. 19a;

FIGS. 20b to 20d show current, voltage and efficiency curves for the amplifier arrangement of FIG. 20a;

FIGS. 21b to 21d show current, voltage and efficiency curves for the amplifier arrangement of FIG. 21a;

FIG. 22b to 22d show current, voltage and efficiency curves for the amplifier arrangement of FIG. 22a;

FIGS. 23b to 23d show current, voltage and efficiency curves for the amplifier arrangement of FIG. 23a;

FIGS. 24b to 24d show current, voltage and efficiency curves for the amplifier arrangement of FIG. 24a;

FIGS. 25b to 25d show current, voltage and efficiency curves for the amplifier arrangement of FIG. 25a;

FIGS. 26b to 26d show current, voltage and efficiency curves for the amplifier arrangement of FIG. 26a;

DETAILED DESCRIPTION

Figure 1A:
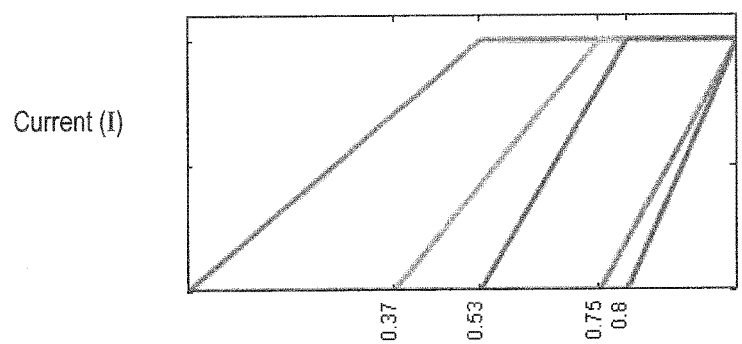
FIGS. 1a to 1c show current, voltage and efficiency curves for a known amplifier arrangement.
Figure 1B:
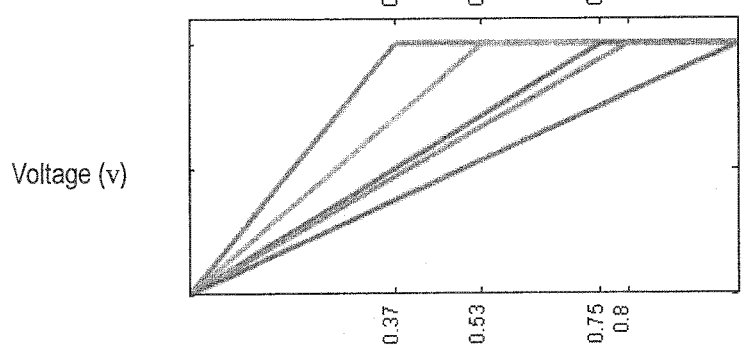
Figure 1C:
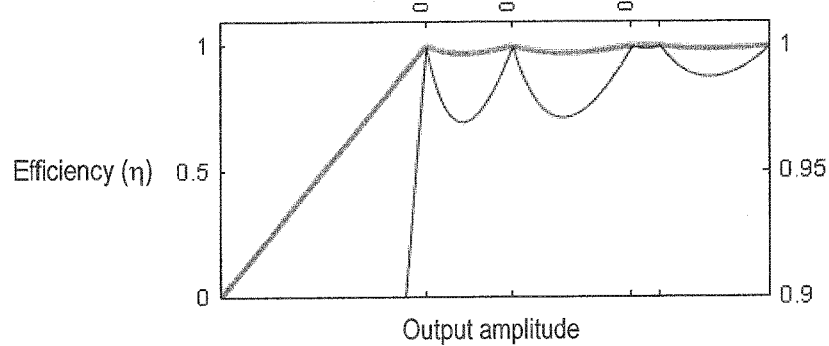
Figure 2A:
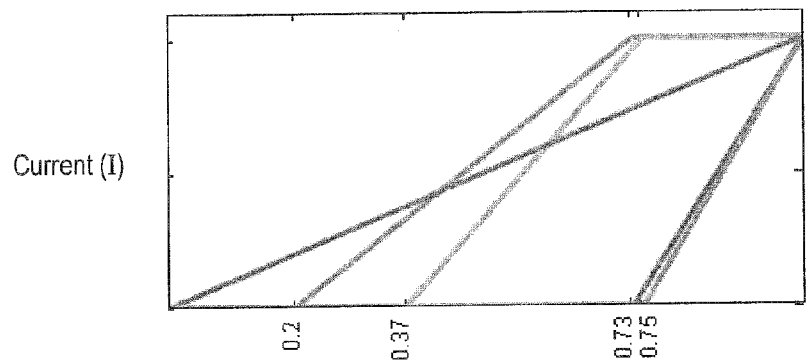
FIGS. 2a to 2c show current, voltage and efficiency curves for a known amplifier arrangement.
Figure 2B:
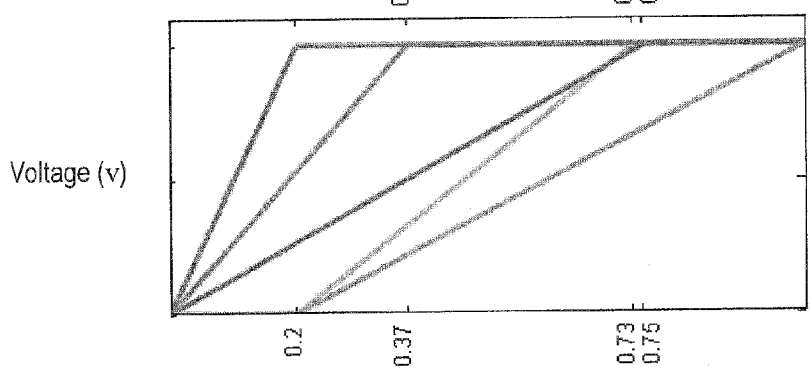
Figure 2C:
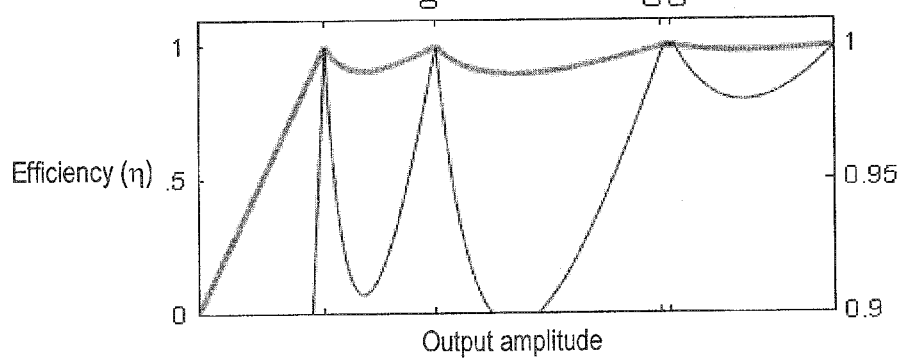
Figure 3A:
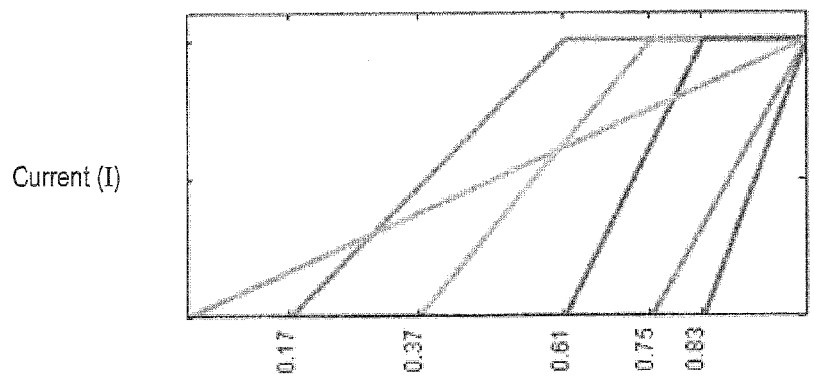
FIGS. 3a to 3c show current, voltage and efficiency curves for a known amplifier arrangement.
Figure 3B:
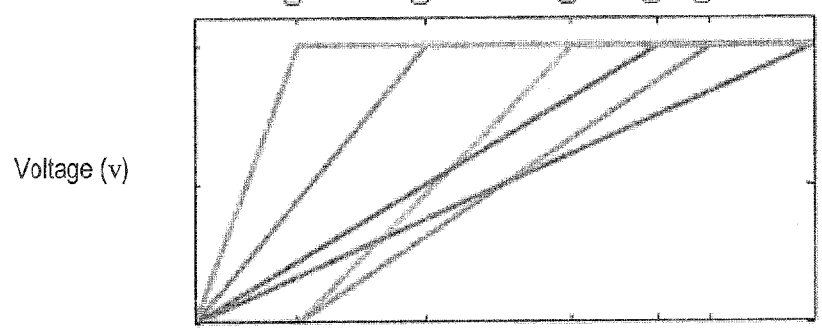
Figure 3C:
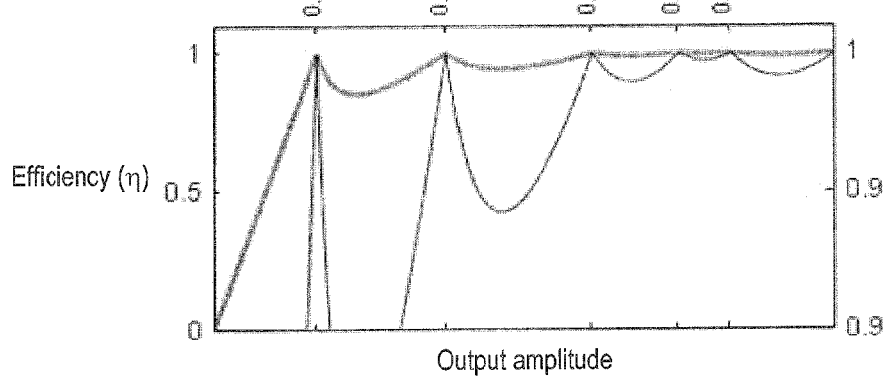
Figure 4A:
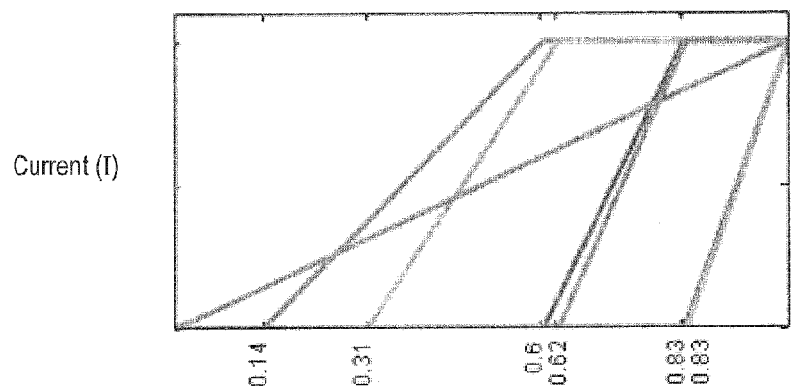
FIGS. 4a to 4c show current, voltage and efficiency curves for a known amplifier arrangement.
Figure 4B:
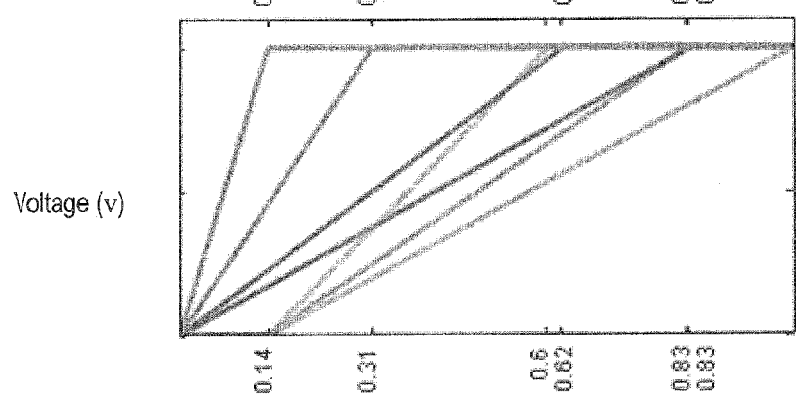
Figure 4C:
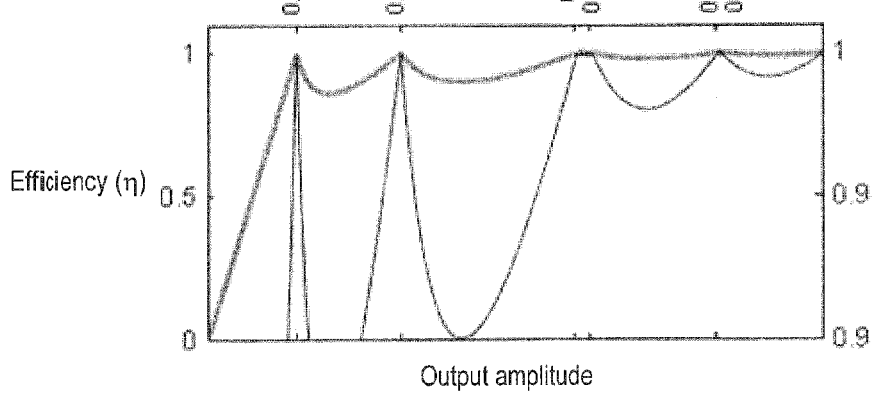

FIG. 5a shows an amplifier arrangement described in co-pending application P39991WO by the present Applicant. In such an example the amplifier arrangement comprises 4 amplifier stages, $10_1$ to $10_4$, although it is noted that the amplifier arrangement can comprise any higher number of amplifier stages, including both even and odd numbers of amplifier stages.

The amplifier arrangement comprises a cascade of quarter wavelength transmission lines $11_1$ to $11_3$ coupled between an output of an amplifier of a first amplifier stage $10_1$ and an output node 15 of the amplifier arrangement. The cascade comprises three quarter wavelength transmission lines $11_1$ to $11_3$ in this example.

An amplifier of the 4th stage $10_4$ is coupled to the output node, and remaining amplifiers between the $1^{st}$ and $4^{th}$ stages (amplifiers $10_2$ and $10_3$ in this example) are coupled to successive junctions in the cascade of quarter wavelength transmission lines $11_1$ to $11_3$.

The amplifier arrangement is configured such that the amplifier of the 4th stage $10_4$ is coupled to the output node 15 via a connecting quarter wavelength transmission line $13_1$, with each of the remaining amplifiers closest to the output node 15 apart from the first and second amplifiers $10_1$, $10_2$ (being just the amplifier of stage $10_3$ in this particular example), being coupled by a respective connecting quarter wavelength transmission line ($13_2$ in this example) to a junction of the cascade of quarter wavelength transmission lines.

The arrangement shown in FIG. 5a can be used with an increasing number of amplifiers stages, for both odd and even numbers of amplifier stages N.

The cascade may comprise a cascade of quarter wavelength transmission lines whose characteristic impedance decreases towards the output node 15 as shown. Alternatively, since every quarter wavelength transmission line can double as an impedance transformer, it is possible to transform the impedances so that the impedance of a later segment of the quarter wavelength cascade has an equal or higher impedance, than the previous segment. Thus, alternative arrangements may provide such transformations, rather than having characteristic impedances which decrease towards the output node. This may be desirable in certain implementation technologies (for example PCB or substrate materials) where it is difficult to achieve high impedance lines, since they become very narrow, while in some implementations it is difficult to achieve low impedance lines, since they become too wide.

In more general terms, the amplifier arrangement of the co-pending application P39991WO, comprises N amplifier stages, $10_1$ to $10_N$, wherein N is an integer equal or greater than four.

The amplifier arrangement comprises a cascade of quarter wavelength transmission lines $11_1$ to $11_{N-1}$ coupled between an output of an amplifier of a first amplifier stage $10_1$ and an output node 15 of the amplifier arrangement. The cascade comprises N-1 quarter wavelength transmission lines $11_1$ to $11_{N-1}$.

An amplifier of the Nth stage $10_N$ is coupled to the output node, and remaining amplifiers between the first and Nth stages $10_2$ to $10_{N-1}$ coupled to successive junctions in the cascade of quarter wavelength transmission lines $11_1$ to $11_{N-1}$.

The amplifier arrangement is configured such that the amplifier $10_N$ of the Nth stage is coupled to the output node 15 via a connecting quarter wavelength transmission line $13_1$, with each of the remaining amplifiers $10_3$ to $10_{N-1}$ of the N-2 stages closest to the output node 15 being coupled by a respective connecting quarter wavelength transmission line $13_1$ to $13_{N-2}$ to a junction of the cascade of quarter wavelength transmission lines.

Such an arrangement has the advantage of providing good efficiency for high PAR signals even with equal size transistors, due to high density of transition points at low output amplitudes.

It can be seen from the above that co-pending application P39991WO describes 4-stage and higher ("N-stage") amplifier arrangements, and in particular a Doherty amplifier arrangement, whereby the N-2 amplifiers closest to the output are coupled by quarter wavelength lines to the junctions of the cascade of quarter wavelength lines (consisting of N-1 quarter wavelength lines of decreasing characteristic impedance towards the output).

Figure 5B:
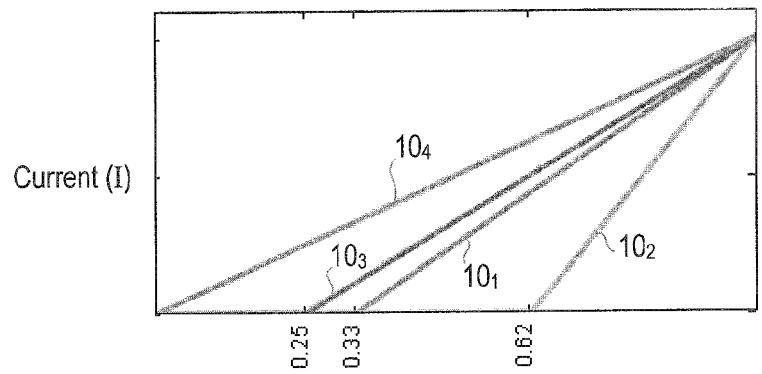

FIG. 5b shows a plot of current against output amplitude for the four-stage arrangement shown in FIG. 5a. The order of the amplifier starting points in this example is amplifier $10_4$ starting at zero, amplifier $10_3$ starting at 0.25 of full output amplitude, amplifier $10_1$ starting at 0.33 of full output amplitude, and amplifier $10_2$ starting at 0.62 of full output amplitude.

Figure 5C:
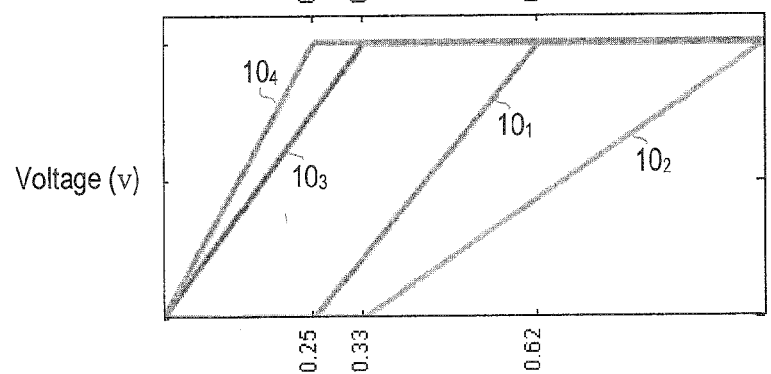

FIG. 5c shows a plot of voltage against output amplitude for the four-stage arrangement shown in FIG. 5a.

Figure 5D:
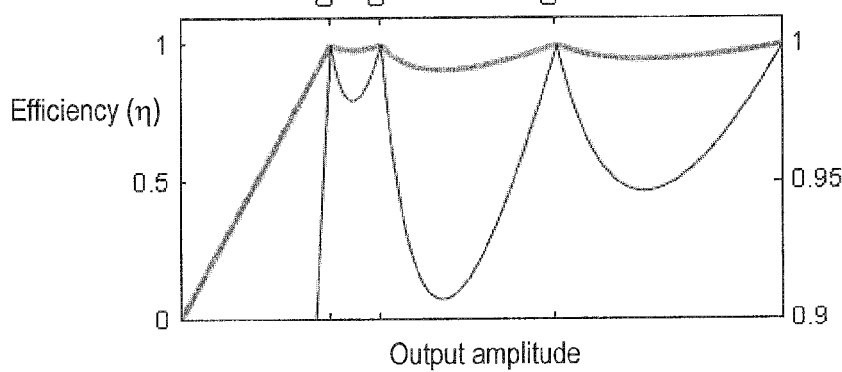

FIG. 5d shows a plot of efficiency against output amplitude for the four-stage arrangement shown in FIG. 5a.

It can be seen from the above that the amplifier stages (transistors, constituent amplifiers) connected to the output node 15 (i.e. amplifier $10_4$) and to the quarterwave cascade junction one quarter wavelength from the output (i.e. amplifier $10_3$) are connected via quarter wave lines. This is different from a regular multistage Doherty amplifier arrangement in which no such quarter wave lines are used. The quarterwave cascade itself contains three quarter wavelength lines, whereas the arrangement in prior art systems such as EP2403135 only have one quarterwave-connected stage, at the output, and a quarterwave cascade consisting of only two quarter wave lines.

It can be seen from FIG. 5b that the current amplitudes are zero below, and (piecewise) linear above respective transition points (and zero). All current amplitudes are then linear up to the maximum output.

With increasing amplitude, a new amplifier needs to start delivering current only when a previous amplifier has reached its maximum voltage (saturation). As for all Doherty amplifiers, the RF output voltages and currents at an amplifier stage are always in phase in the ideal implementation (and at center frequency).

The relative phases of the drive signals to the amplifiers are easily found by inspection of the electrical length from each amplifier to the common output node 15 (i.e. time delay over the lengths of transmission line). In this specific example, amplifiers $10_2$ and $10_3$ of the second and third amplifier stages are configured to have phase offsets of −90 degrees (a quarter RF cycle) relative to the phase of amplifier $10_4$ of the fourth amplifier stage, and amplifier $10_1$ of the first amplifier stage configured to have a phase offset of −180 degrees (a half RF cycle). At least for wideband implementations the offsets can be implemented as time delays (which is also convenient for microwave implementations, where they can be implemented with transmission lines).

In the example of FIG. 5a each of the amplifiers in the amplifier stages ($10_1$ to $10_4$) is of a substantially equal size. By substantially equal size is meant that the amplifiers may be of the same generally type, or that the amplifiers may be configured to provide similar drive currents and/or voltages.

Furthermore, in this example the characteristic impedance of each successive stage in the cascade of quarter wavelength transmission lines $11_1$ to $11_3$ is reduced towards the output node. For example, the characteristic impedance may be reduced to the parallel combination of the preceding connecting transmission lines whereby the characteristic impedance of each successive stage is reduced to 1/M of the impedance of the transmission line from a single amplifier, whereby M relates to the number of preceding amplifiers. For example, for equal connecting characteristic impedance it reduces as 1/M, where M is the number of preceding amplifiers (i.e. amplifier connected to the input side of a particular point). Therefore, in an example where a particular point has two preceding amplifiers connected by equal connecting characteristic impedances, the characteristic impedance is halved (1/M=½).

Also, in this example, the characteristic impedance of each of the connecting quarter wavelength transmission lines $13_1$ to $13_2$ is substantially equal.

Referring to FIG. 5d, the efficiency curve for such an amplifier arrangement designed for four equal size transistors (and substantially the same characteristic impedance in the connecting transmission lines and/or connecting part of the quarterwave cascade junction) has four peaks; at 0.25, 0.33, 0.62 and 1 of full output amplitude.

Figure 5E:
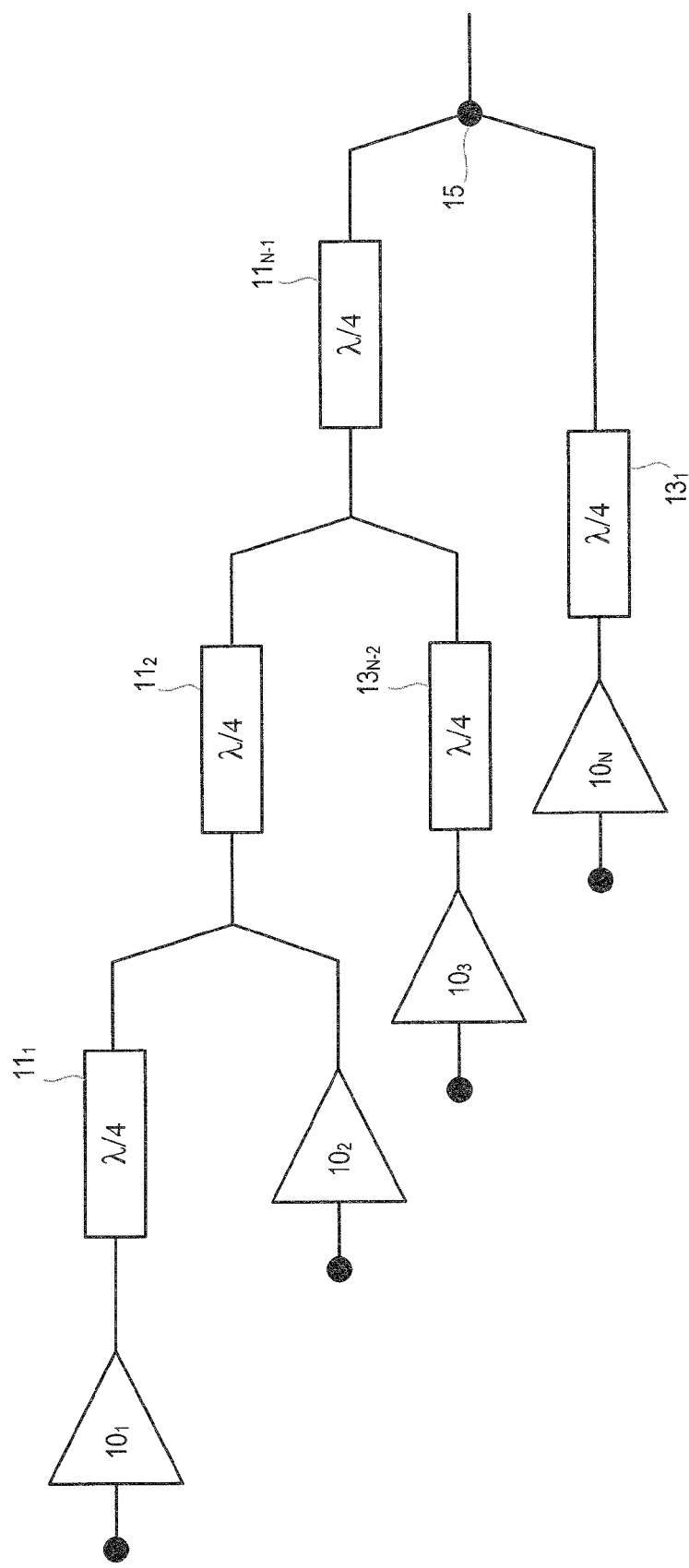

FIG. 5e shows a schematic diagram of the arrangement of FIG. 5a.

The arrangements shown in FIGS. 5a and 5e above have the advantage of being more efficient than prior art solutions for signals with Rayleigh distributed amplitudes with PAR above 9 dB.

Correctly tuned amplifiers have high, ideally infinite, impedance at the output. This high impedance is transformed by a quarterwave line so that the other end has a low (close to short circuit) impedance. Since the amplifier $10_4$ of FIG. 5a is connected by a quarterwave line to the output node 15, the output is thus short circuited when seen from amplifiers in the quarterwave cascade. In analogy with the traditional 2-stage Doherty amplifier, the amplifiers in the quarterwave cascade thus work together as an equivalent peaking amplifier to the fourth amplifier $10_4$, which consequentially works as a main, or carrier, amplifier.

In the quarterwave cascade, the same situation holds for the third amplifier $10_3$ relative to the others. The amplifier $10_3$ is connected by a quarterwave line to a junction in the quarterwave cascade. Therefore, this connection point is short circuited for RF voltage from the other amplifiers. These then act together as a peaking amplifier for the third amplifier $10_3$ (i.e. "a peaking amplifier to the peaking amplifier"). The quarter wavelength transmission line of the first amplifier $10_1$ short circuits the connection point for the second amplifier $10_2$, which in the same ways acts as a peaking amplifier for the first amplifier $10_1$. The short circuiting of the connection points is the reason for the quarterwave cascade; a short circuited junction is displaced from the next by a quarter wavelength line that transforms the low impedance to an open circuit or high impedance.

From the above it can be seen that the arrangement of co-pending application P39991WO shows an amplifier configuration whereby quarterwave and directly coupled amplifiers are arranged along the quarterwave cascade to achieve canonical Doherty amplifiers, that have the maximum possible number of high-efficiency transition points.

The embodiments of the present invention are concerned with an alternative arrangement, whereby a partial arrangement similar to that above is provided.

Figure 6A:
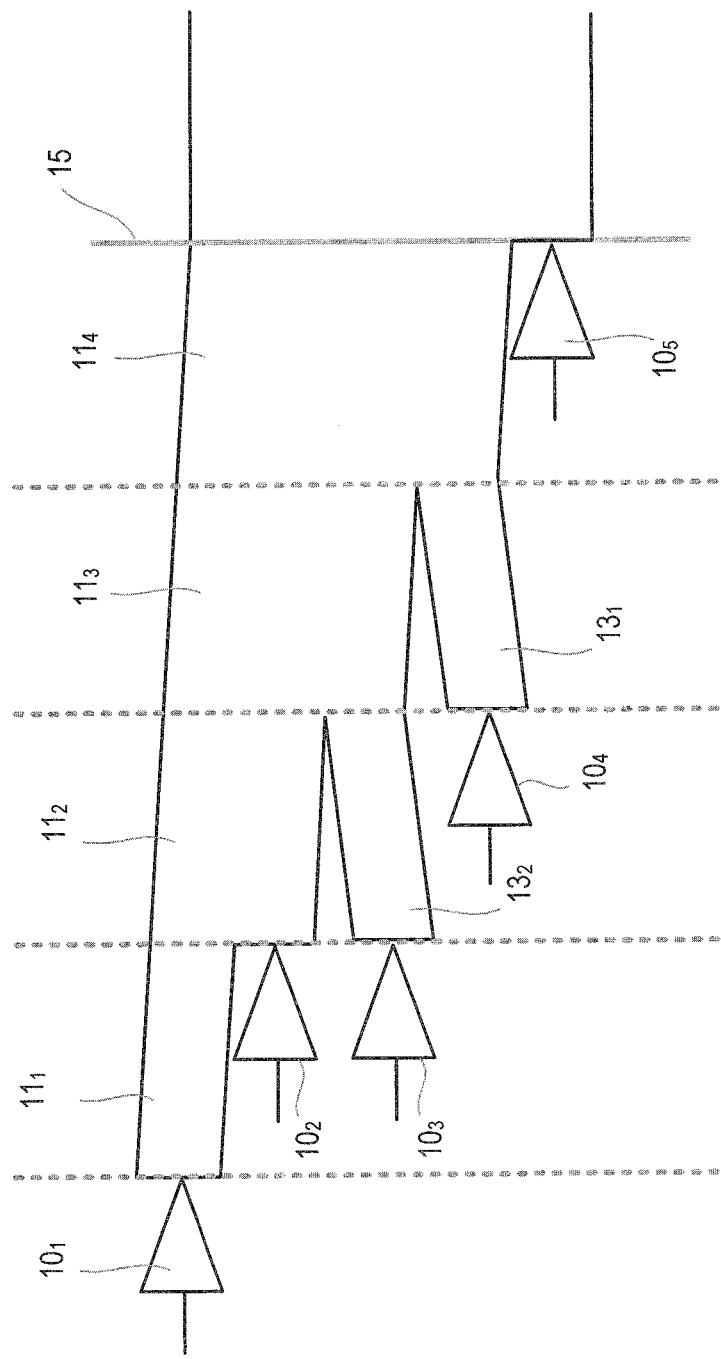
FIG. 6a shows an amplifier arrangement according to an embodiment of the present invention.

FIG. 6a shows an example of an amplifier arrangement comprising five amplifier stages $10_1$ to $10_5$, i.e. N=5, according to an embodiment of the invention.

The amplifier arrangement comprises a cascade of quarter wavelength transmission lines $11_1$ to $11_4$ coupled between an output of an amplifier of a first amplifier stage $10_1$ and an output node 15 of the amplifier arrangement. The cascade comprises four (N−1) quarter wavelength transmission lines $11_1$ to $11_4$.

The first and second amplifiers of the first and second stages $10_1$ and $10_2$ are coupled directly to their respective junctions of the cascade of quarter wavelength transmission lines $11_1$ to $11_4$. However, for the remaining amplifiers ($10_3$ to $10_5$) of the remaining stages, they are coupled to their respective junctions of the cascade of quarter wavelength transmission lines such that successive pairs of amplifiers are either coupled via respective connecting quarter wavelength transmission lines 13 to their respective junctions, or coupled directly to their respective junctions. In this particular example of FIG. 6a they are shown as being coupled via respective connecting quarter wavelength transmission lines 13 to their respective junctions. For an amplifier arrangement that comprises an odd number of amplifier stages $10_1$ to $10_N$, as is the case in FIG. 6a having five amplifier stages, the Nth amplifier stage $10_N$ (i.e. $10_5$ in this example) can either be coupled directly to the output node 15 (as shown in the example of FIG. 6a), or coupled via a connecting quarter wavelength transmission line 13 to the output node 15.

In FIG. 6a the amplifier stages (for example RF power transistors with supporting circuitry and harmonic terminations) are connected to the cascade of quarter wavelength transmission lines at the junctions corresponding to one and two quarter wavelength from the outputs (the third and fourth amplifiers $10_3$, $10_4$ from the input, or top) via connecting quarter wavelength transmission lines 13 (or equivalent circuits). Each connecting quarter wavelength transmission line 13 has a characteristic impedance Ropt, which in this example for each amplifier $10_3$, $10_4$ is 5*Rload.

The characteristic impedance of each successive stage in the cascade of quarter wavelength transmission lines $11_1$ to $11_4$ is reduced towards the output node. For example, the characteristic impedance may be reduced to the parallel combination of the preceding connecting transmission lines whereby the characteristic impedance of each successive stage is reduced to 1/M of the impedance of the transmission line from a single amplifier, whereby M relates to the number of preceding amplifiers. In this example the cascade of quarter wavelength transmission lines contains four quarter wavelength transmission lines ($11_1$, $11_2$, $11_3$ and $11_4$) of characteristic impedance 5*Rload, 5/2*Rload, 5/3*Rload and 5/4*Rload, respectively.

Although this embodiment shows that the cascade may comprise a cascade of quarter wavelength transmission lines whose characteristic impedance decreases towards the output node 15, according to an alternative embodiment, since every quarter wavelength transmission line can double as an impedance transformer, it is possible to transform the impedances so that the impedance of a later segment of the quarter wavelength cascade has an equal or higher impedance, than the previous segment. Thus, alternative arrangements may provide such transformations in a network separate from the amplifier arrangement, rather than having characteristic impedances which decrease towards the output node. This may be desirable in certain implementation technologies (for example PCB or substrate materials) where it is difficult to achieve high impedance lines, since they become very narrow, while in some implementations it is difficult to get low impedance lines, since they get too wide. Thus, an embodiment described herein as having Ropt-matched quarter wavelength transmission lines and decreasing impedance may be realized instead using transformations in a network.

From the above it can be seen that, in more general terms, according to one embodiment of the invention there is provided an amplifier arrangement comprising N amplifier stages $10_1$ to $10_N$, wherein N is an integer equal or greater than five. The amplifier arrangement comprises a cascade of quarter wavelength transmission lines coupled between an output of an amplifier of a first amplifier stage $10_1$ and an output node 15 of the amplifier arrangement, wherein the cascade comprises N−1 quarter wavelength transmission lines $11_1$ to $11_{N-1}$. An amplifier of the Nth stage $10_N$ is coupled to the output node 15, and remaining amplifiers between the first and Nth stages $10_1$ to $10_{N-1}$ coupled to successive junctions in the cascade of quarter wavelength transmission lines $11_1$ to $11_{N-1}$. The amplifier arrangement is further configured such that, apart from first and second amplifiers $10_1$ and $10_2$ coupled to first and second junctions of the cascade of quarter wavelength transmission lines, the remaining amplifiers $10_3$ to $10_N$ are coupled to their respective junctions of the cascade of quarter wavelength transmission lines such that successive pairs of amplifiers are either coupled via respective connecting quarter wavelength transmission lines 13 to their respective junctions, or coupled directly to their respective junctions.

When the amplifier arrangement comprises an odd number of amplifier stages $10_1$ to $10_N$, then according to one embodiment the Nth amplifier stage $10_N$ is coupled directly to the output node 15. When the amplifier arrangement comprises an odd number of amplifier stages $10_1$ to $10_N$, according to an alternative embodiment the Nth amplifier stage $10_N$ is coupled via a connecting quarter wavelength transmission line 13 to the output node 15.

The cascade may comprise a cascade of quarter wavelength transmission lines whose characteristic impedance decreases towards the output node 15.

Figure 6B:
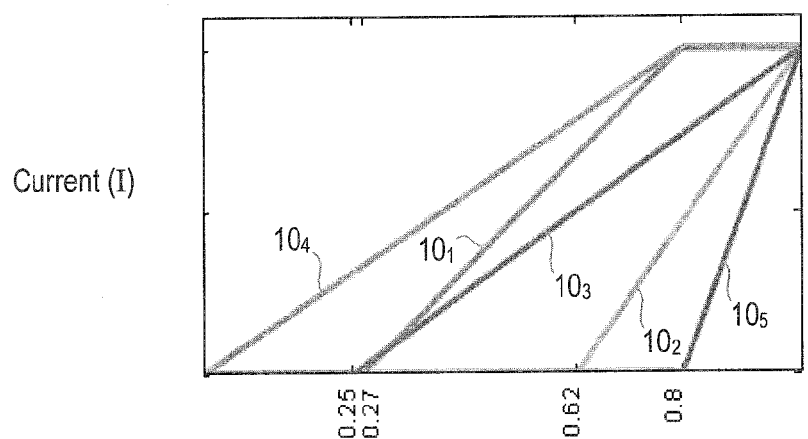
FIGS. 6b to 6d show current, voltage and efficiency curves for the amplifier arrangement of FIGS. 6a and 6b.

FIG. 6b shows a plot of current against output amplitude for the five-stage embodiment of the present invention as shown in FIG. 6a. The order of the amplifier starting points in this example is amplifier $10_4$ starting at zero, amplifier $10_1$ starting at 0.25 of full output amplitude, amplifier $10_3$ starting at 0.27 of full output amplitude, amplifier $10_2$ starting at 0.62 of full output amplitude, and amplifier $10_5$ starting at 0.8 of full output amplitude.

The current amplitudes are zero below, and (piecewise) linear above respective transition points (and zero). The current amplitudes of three of the amplifiers (amplifiers $10_3$, $10_2$ and $10_5$) are then linear up to the maximum output, and two (amplifiers $10_4$ and $10_1$) are limited in the same amplitude above the last transition point. This amplifier arrangement thus has the advantage of having only one amplitude-limiting point that is shared for two of the currents. This means that this limiting can be performed in one circuit (for example by saturation in an amplifier, subtraction of the signal from a class C stage, etc.) before distribution to the respective amplifiers $10_4$ and $10_1$.

With increasing amplitude, a new amplifier needs to start delivering current only when a previous amplifier has reached its maximum voltage (saturation). As for all Doherty amplifiers, the RF output voltages and currents at an amplifier stage are always in phase in the ideal implementation (and at center frequency).

The relative phases of the drive signals to the amplifiers are easily found by inspection of the electrical length from each amplifier to the common output (i.e. time delay over the lengths of transmission line). In this specific example, amplifier $10_1$ can be configured to have a phase offset of −360 (or equivalently, zero) degrees, amplifiers $10_2$ and $10_3$ configured to have phase offsets of −270 degrees (three quarters of an RF cycle), and amplifier $10_4$ configured to have a phase offset of −180 degrees, relative to the phase of amplifier $10_5$ (equal to the output node), at center frequency. For wideband implementations the offsets are preferably implemented as time delays (which is also convenient for microwave implementations, where they can be implemented with transmission lines).

Figure 6C:
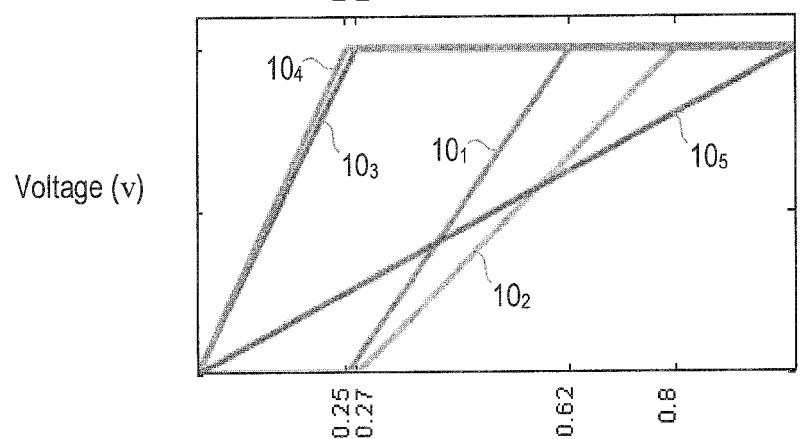

FIG. 6c shows the voltages of the respective amplifier stages $10_1$ to $10_5$ relative to full output amplitude.

Figure 6D:
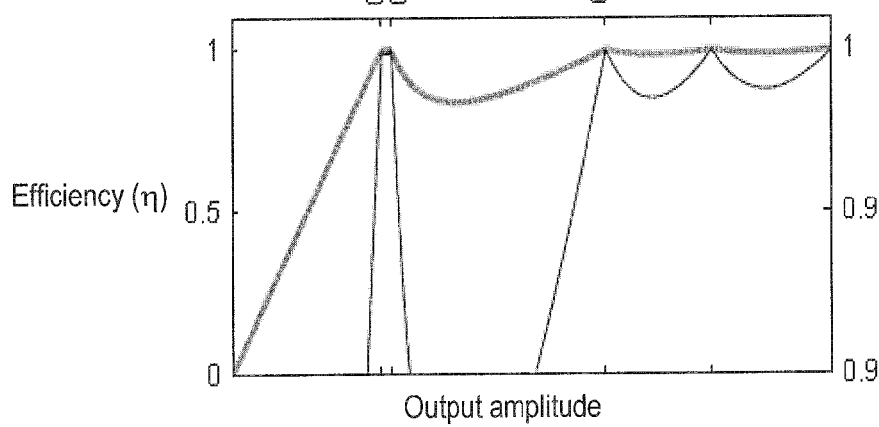

Referring to FIG. 6d, the efficiency curve for an amplifier designed for five equal size transistors has peaks at 0.25, 0.27, 0.62, 0.8 and 1 of full output amplitude. This distribution of transition points is advantageous for high-PAR signals, and better that the prior art solutions for all relevant Rayleigh PAR values.

FIGS. 7 and 8 show how the invention may be applied to examples of amplifier arrangements comprising 6-stages of amplifiers.

Figure 7A:
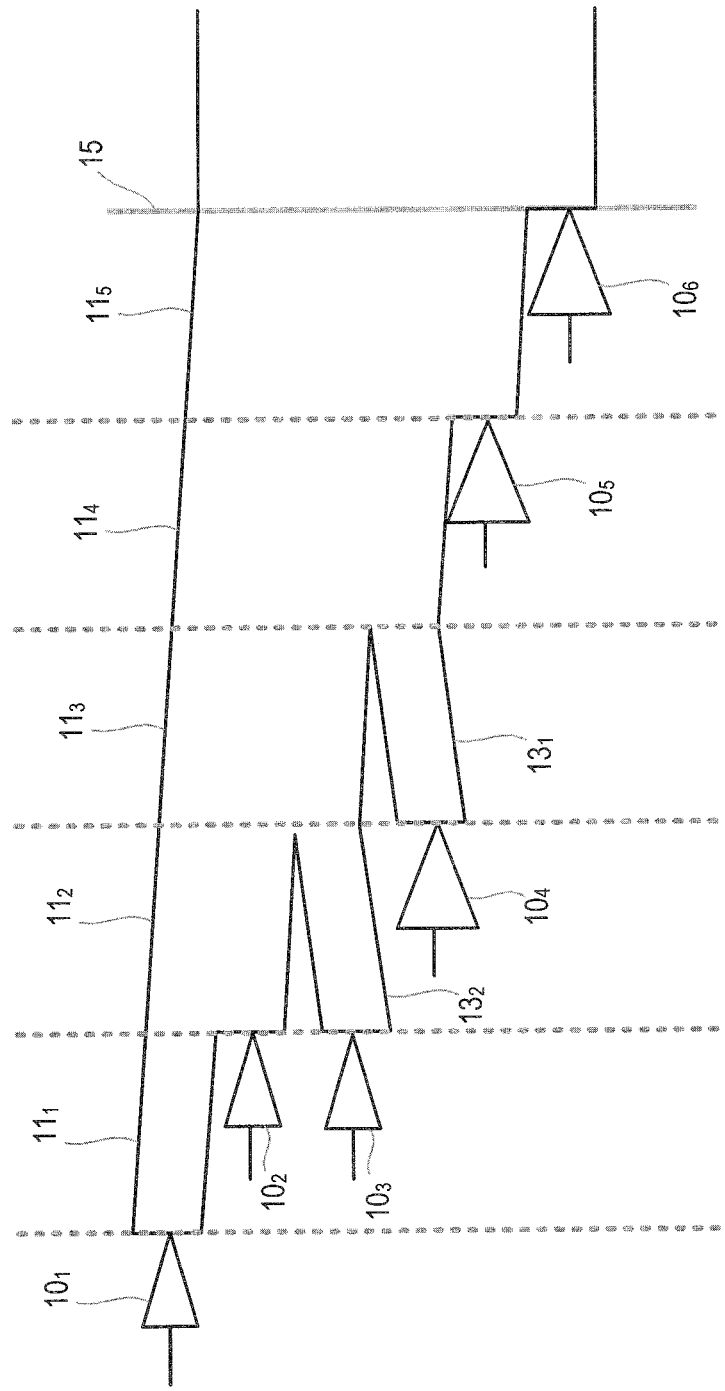
FIG. 7a shows an amplifier arrangement according to an embodiment of the present invention.

FIG. 7a has the pair of amplifiers $10_3$ and $10_4$ coupled via connecting quarter wavelength transmission lines to their respective junctions in the cascade of quarter wavelength transmission lines, with the succeeding pair of amplifiers $10_5$ and $10_6$ connected directly (or equivalently, by half wavelengths) to the cascade of quarter wavelength transmission lines.

FIG. 8a, on the other hand, has the pair of amplifiers $10_3$ and $10_4$ connected directly (or equivalently, by half wavelengths) to the cascade of quarter wavelength transmission lines, while the succeeding pair of amplifiers $10_5$ and $10_6$ are coupled via connecting quarter wavelength transmission lines 13.

Referring in more detail to FIG. 7a, it shows an example of an amplifier arrangement comprising six amplifier stages $10_1$ to $10_6$, i.e. N=6.

The amplifier arrangement comprises a cascade of quarter wavelength transmission lines $11_1$ to $11_5$ coupled between an output of an amplifier of a first amplifier stage $10_1$ and an output node 15 of the amplifier arrangement. The cascade comprises five (N−1) quarter wavelength transmission lines $11_1$ to $11_5$ of decreasing characteristic impedance towards the output node.

The first and second amplifiers $10_1$ and $10_2$ are coupled directly to their respective junctions of the cascade of quarter wavelength transmission lines $11_1$ to $11_5$. However, for the remaining amplifiers ($10_3$ to $10_6$), they are coupled to their respective junctions of the cascade of quarter wavelength transmission lines such that successive pairs of amplifiers are either coupled via respective connecting quarter wavelength transmission lines 13 to their respective junctions, or coupled directly to their respective junctions. In this particular example of FIG. 7a, as mentioned above a first pair of amplifiers $10_3$ and $10_4$ are coupled via connecting quarter wavelength transmission lines to their respective junctions in the cascade of quarter wavelength transmission lines, with a second pair (the succeeding pair) of amplifiers $10_5$ and $10_6$ being connected directly (or equivalently, by half wavelengths) to the cascade of quarter wavelength transmission lines.

Figures 7B, 7C, 7D:
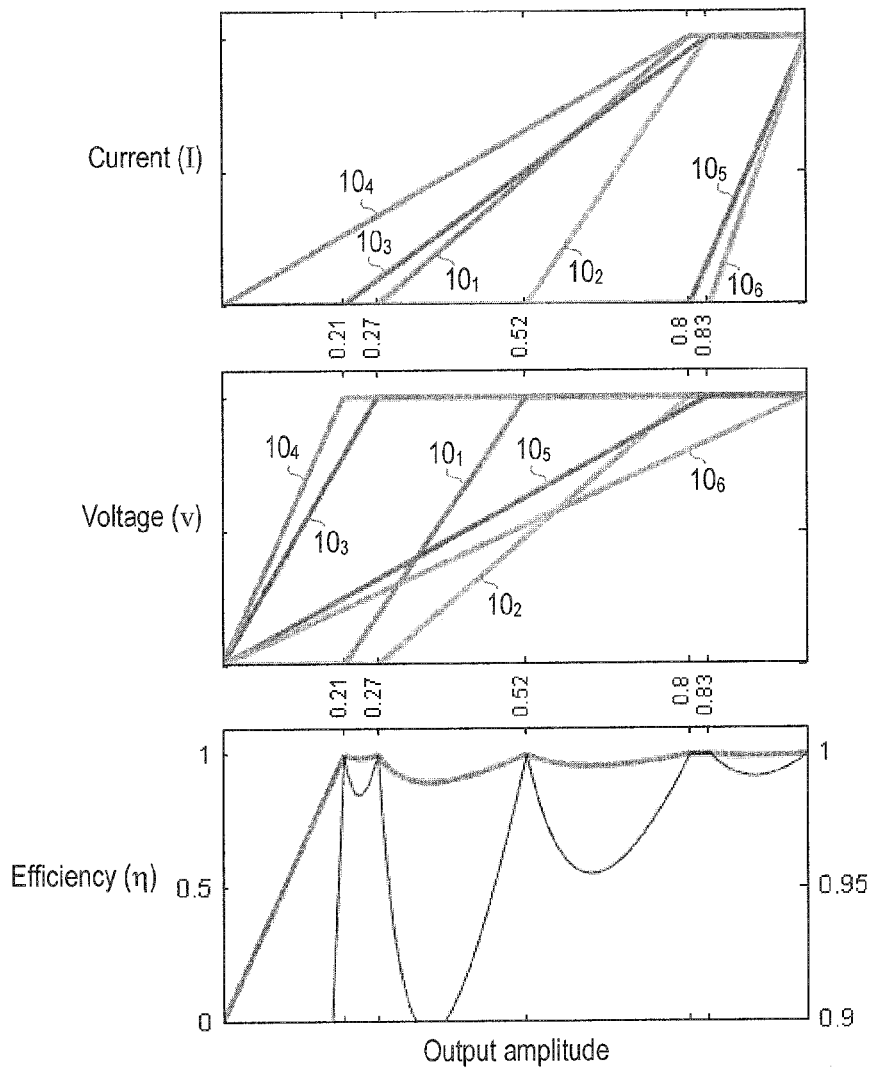

FIG. 7b shows a plot of current against output amplitude for the six-stage embodiment of the present invention as shown in FIG. 7a. The order of the amplifier starting points in this example is amplifier $10_4$ starting at zero, amplifier $10_3$ starting at 0.21 of full output amplitude, amplifier $10_1$ starting at 0.27 of full output amplitude, amplifier $10_2$ starting at 0.52 of full output amplitude, amplifier $10_5$ starting at 0.8 of full output amplitude, and amplifier $10_6$ starting at 0.83 of full output amplitude.

The current amplitudes are zero below, and (piecewise) linear above respective transition points (and zero). The current amplitudes of two of the amplifiers (amplifiers $10_5$ and $10_6$) are then linear up to the maximum output, and four (amplifiers $10_4$, $10_3$, $10_1$ and $10_2$) are approximately limited in the same amplitude above the last transition point. This amplifier arrangement thus has the advantage of having effectively only one amplitude-limiting point that can be shared for two of the currents. This means that this limiting can be performed in one circuit (for example by saturation in an amplifier, subtraction of the signal from a class C stage, etc.) before distribution to the respective amplifiers $10_4$, $10_3$, $10_1$ and $10_2$. This is possible because, in practice, one can use the same limiting point (using only one circuit) if the two points are close, as shown in FIG. 7b. This is partly due to the "soft" nature of the saturation in the transistors. The effect of this is that one of the transistors goes a little more into saturation before this external limiter kicks in. Although there may be some distortion locally from using this technique, thus not achieving exactly optimal efficiency, this difference will be small, since two very close efficiency peaks act almost as one efficiency peak, so the efficiency will be similar to an amplifier with only one efficiency peak at that point, i.e. an amplifier with one less transistor. When the efficiency peaks are further apart, this simplification cannot be used without greater loss of efficiency. In such a case it can be preferable to require two limiters, limiting the drive signal to two transistors each.

FIG. 7c shows the voltages of the respective amplifier stages $10_1$ to $10_6$ relative to full output amplitude.

Referring to FIG. 7d, the efficiency curve for an amplifier designed for six equal size transistors has peaks at 0.21, 0.27, 0.52, 0.8, 0.83 and 1 of full output amplitude. This distribution of transition points is advantageous for high-PAR signals, and better that the prior art solutions for all relevant Rayleigh PAR values.

Referring in more detail to FIG. 8a, it shows another example of an amplifier arrangement comprising six amplifier stages $10_1$ to $10_6$, i.e. N=6, according to an embodiment of the invention.

The amplifier arrangement comprises a cascade of quarter wavelength transmission lines $11_1$ to $11_5$ coupled between an output of an amplifier of a first amplifier stage $10_1$ and an output node 15 of the amplifier arrangement. The cascade comprises five (N−1) quarter wavelength transmission lines $11_1$ to $11_5$ of decreasing characteristic impedance towards the output node.

The first and second amplifiers $10_1$ and $10_2$ are coupled directly to their respective junctions of the cascade of quarter wavelength transmission lines $11_1$ to $11_5$. However, for the remaining amplifiers ($10_3$ to $10_6$), they are coupled to their respective junctions of the cascade of quarter wavelength transmission lines such that successive pairs of amplifiers are either coupled via respective connecting quarter wavelength transmission lines 13 to their respective junctions, or coupled directly to their respective junctions. In this particular example of FIG. 8a, as mentioned above a first pair of amplifiers $10_3$ and $10_4$ are connected directly (or equivalently, by half wavelengths) to the cascade of quarter wavelength transmission lines, while a second pair (the succeeding pair) of amplifiers $10_5$ and $10_6$ are coupled via connecting quarter wavelength transmission lines 13.

Figure 8B:
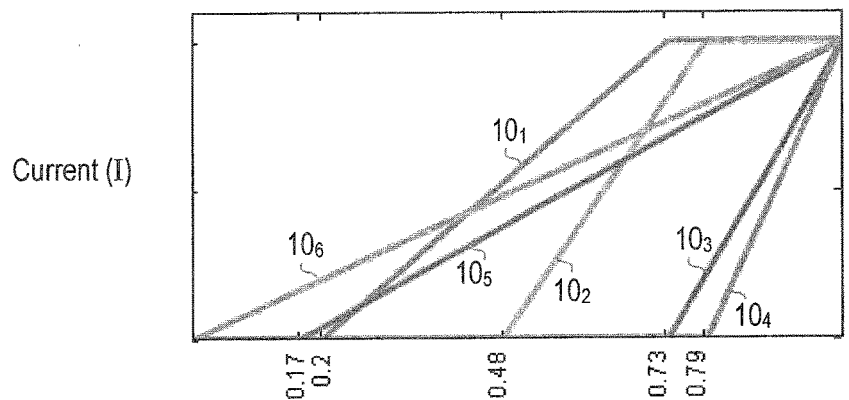

FIG. 8b shows a plot of current against output amplitude for the six-stage embodiment of the present invention as shown in FIG. 8a. The order of the amplifier starting points in this example is amplifier $10_6$ starting at zero, amplifier $10_5$ starting at 0.17 of full output amplitude, amplifier $10_1$ starting at 0.2 of full output amplitude, amplifier $10_2$ starting at 0.48 of full output amplitude, amplifier $10_3$ starting at 0.73 of full output amplitude, and amplifier $10_4$ starting at 0.79 of full output amplitude.

The current amplitudes are zero below, and (piecewise) linear above respective transition points (and zero). The current amplitudes of four of the amplifiers (amplifiers $10_6$, $10_5$, $10_3$ and $10_4$) are then linear up to the maximum output, and two (amplifiers $10_1$ and $10_2$) are approximately limited in the same amplitude above certain transition points. This amplifier arrangement thus has the advantage of having only two amplitude-limiting points for two of the currents. This means that this limiting can be performed in two circuits only (for example by saturation in an amplifier, subtraction of the signal from a class C stage, etc.) before distribution to the respective amplifiers $10_1$ and $10_2$.

Figure 8C:
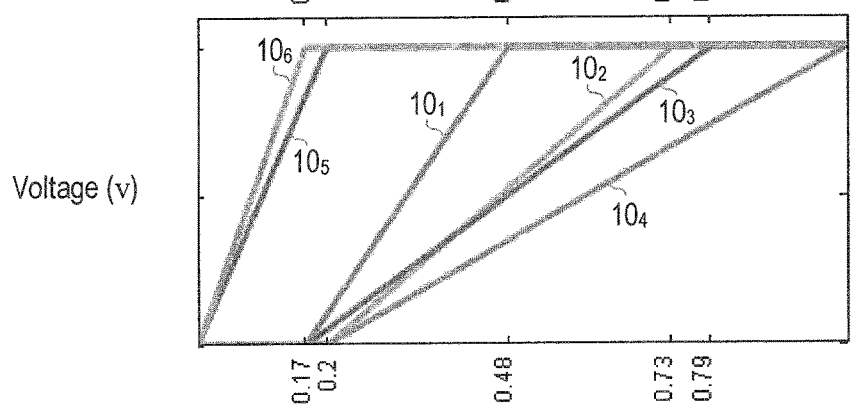

FIG. 8c shows the voltages of the respective amplifier stages $10_1$ to $10_6$ relative to full output amplitude.

Figure 8D:
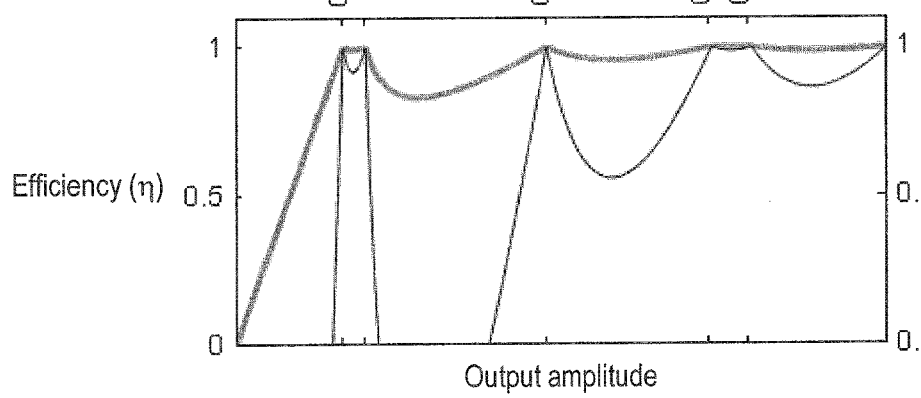

Referring to FIG. 8d, the efficiency curve for an amplifier designed for six equal size transistors has peaks at 0.17, 0.2, 0.48, 0.73, 0.79 and 1 of full output amplitude. This distribution of transition points is advantageous for high-PAR signals, and better that the prior art solutions for all relevant Rayleigh PAR values.

In the embodiments described above, each of the amplifiers in the N amplifier stages $10_1$ to $10_N$ is substantially equal in size. Furthermore, in the embodiments described above the characteristic impedance of each of the connecting quarter wavelength transmission lines 13 is substantially equal.

Dimensioned for equal contributions to maximum output power (as in the previous examples), the efficiency peaks are not entirely optimally distributed for high PAR signals. An even more optimal distribution may be achieved by allowing any combination of maximum output powers. This is nearly achievable, for example in some MMIC implementations, wherein the smallest transistor size difference is determined by the output power of a unity cell of which usually a large number are combined to make a full transistor.

When designing with prefabricated transistors, only a small selection of transistor sizes is generally available.

Thus, according to another aspect of the invention, there will be described an amplifier arrangement similar to that of FIG. 6a, but whereby just two different transistor sizes are used, for example one being twice the size of the other. As will be explained below with reference to FIGS. 9a to 9d, such an arrangement has an improved distribution of transition points.

Thus, according to another embodiment of the invention there is provided an amplifier arrangement wherein at least one amplifier of the amplifier arrangement is different in size to the other amplifiers of the amplifier arrangement. In such an embodiment a characteristic impedance of a corresponding quarter wavelength transmission line is different to the characteristic impedance of the quarter wavelength transmission lines associated with the other amplifiers of the amplifier arrangement, as will be explained further below.

For example, one amplifier of the amplifier pair may be reduced in size compared to the other amplifier (for example halved in size), and wherein a characteristic impedance of a connecting quarter wavelength transmission line 13 connecting the reduced amplifier to its respective junction of the cascade of quarter wavelength transmission lines is increased compared to the characteristic impedance of the connecting quarter wavelength transmission line 13 connecting the other amplifier of the amplifier pair to its respective junction of the cascade of quarter wavelength transmission lines (for example whereby the characteristic impedance is doubled). It is noted that an amplifier may be reduced in size by a different amount, and the characteristic impedance increased by a corresponding different amount, depending upon a particular application.

Figure 9A:
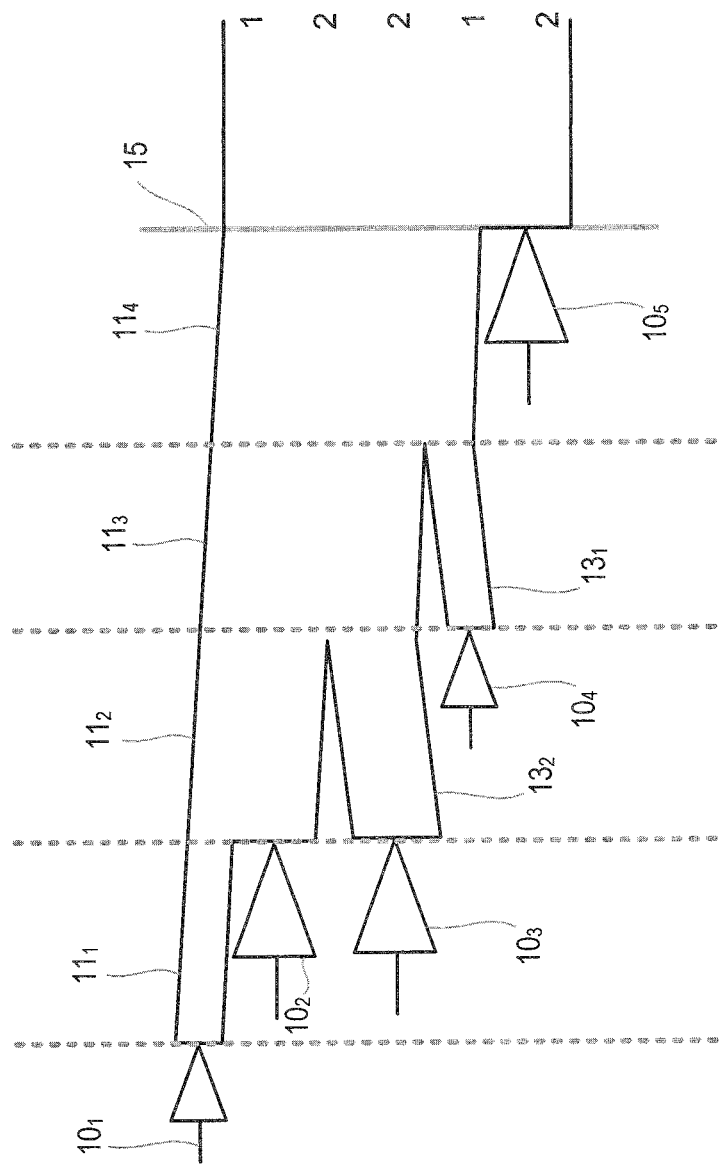
FIG. 9a shows an amplifier arrangement according to an embodiment of the present invention.

FIG. 9a shows an example of an amplifier arrangement comprising five amplifier stages $10_1$ to $10_5$, i.e. N=5, according to another embodiment of the invention.

The amplifier arrangement comprises a cascade of quarter wavelength transmission lines $11_1$ to $11_4$ coupled between an output of an amplifier of a first amplifier stage $10_1$ and an output node 15 of the amplifier arrangement. The cascade comprises four (N−1) quarter wavelength transmission lines $11_1$ to $11_4$ of decreasing characteristic impedance towards the output node.

The first and second amplifiers $10_1$ and $10_2$ are coupled directly to their respective junctions of the cascade of quarter wavelength transmission lines $11_1$ to $11_4$. However, for the remaining amplifiers ($10_3$ to $10_5$), they are coupled to their respective junctions of the cascade of quarter wavelength transmission lines such that successive pairs of amplifiers are either coupled via respective connecting quarter wavelength transmission lines 13 to their respective junctions, or coupled directly to their respective junctions. In this particular example of FIG. 9a they are shown as being coupled via respective connecting quarter wavelength transmission lines 13 to their respective junctions. Since the amplifier arrangement comprises an odd number of amplifiers, in this particular example the Nth amplifier stage, i.e. the $5^{th}$ stage amplifier $10_5$ is coupled directly to the output node 15 (as shown in the example of FIG. 9a, or equivalently via a half wavelength transmission line), to the output node 15.

In contrast to FIG. 6a, however, in this embodiment one of the amplifiers from an amplifier pair, e.g. amplifier $10_4$ from the pair $10_3/10_4$, is reduced in size compared to the other amplifier in the pair. It will be noted that, in this particular example, the amplifier $10_4$ is also reduced in size compared to the other amplifiers, such as amplifiers $10_1$, $10_2$ and $10_5$.

A characteristic impedance of a connecting quarter wavelength transmission line 13 connecting the reduced amplifier $10_4$ to its respective junction of the cascade of quarter wavelength transmission lines is increased compared to the characteristic impedance of the connecting quarter wavelength transmission line 13 connecting the other amplifier $10_3$ of the amplifier pair to its respective junction of the cascade of quarter wavelength transmission lines. In the example of FIG. 9a the amplifier $10_4$ is halved in size compared to the amplifier $10_3$, with the characteristic impedance of the connecting quarter wavelength transmission line 13 doubled compared to the other. In is noted that, according to another embodiment, the other amplifier in the amplifier pair may be reduced, i.e. vice versa, such that the amplifier $10_3$ is halved in size compared to the amplifier $10_4$, with the characteristic impedance of the connecting quarter wavelength transmission line 13 doubled compared to the other.

Figure 9B:
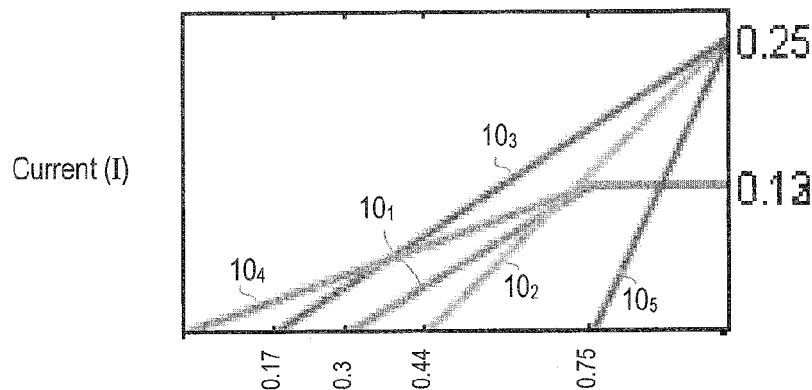

FIG. 9b shows a plot of current against output amplitude for the five-stage embodiment of the present invention as shown in FIG. 9a. The order of the amplifier starting points in this example is amplifier $10_4$ starting at zero, amplifier $10_3$ starting at 0.17 of full output amplitude, amplifier $10_1$ starting at 0.3 of full output amplitude, amplifier $10_2$ starting at 0.44 of full output amplitude, and amplifier $10_5$ starting at 0.75 of full output amplitude.

The current amplitudes are zero below, and (piecewise) linear above respective transition points (and zero). The current amplitudes of three of the amplifiers (amplifiers $10_3$, $10_2$ and $10_5$) are then linear up to the maximum, and two (amplifiers $10_4$ and $10_1$) are limited to the same amplitude as each other (but different to that of the first group), about the last transition point. This amplifier arrangement thus has the advantage of having only one amplitude-limiting point that is shared for two of the currents. This means that this limiting can be performed in one circuit (for example by saturation in an amplifier, subtraction of the signal from a class C stage, etc.) before distribution to the respective amplifiers $10_4$ and $10_1$.

The relative phases of the drive signals to the amplifiers are easily found by inspection of the electrical length from each amplifier to the common output (i.e. time delay over the lengths of transmission line). In this specific example, amplifier $10_1$ can be configured to have a phase offset of −360 (or equivalently, zero) degrees, amplifiers $10_2$ and $10_3$ configured to have phase offsets of −270 degrees (three quarters of an RF cycle), and amplifier $10_4$ configured to have a phase offset of −180 degrees, relative to the phase of amplifier $10_5$ (equal to the output node), at center frequency. For wideband implementations the offsets are preferably implemented as time delays (which is also convenient for microwave implementations, where they can be implemented with transmission lines).

Figure 9C:
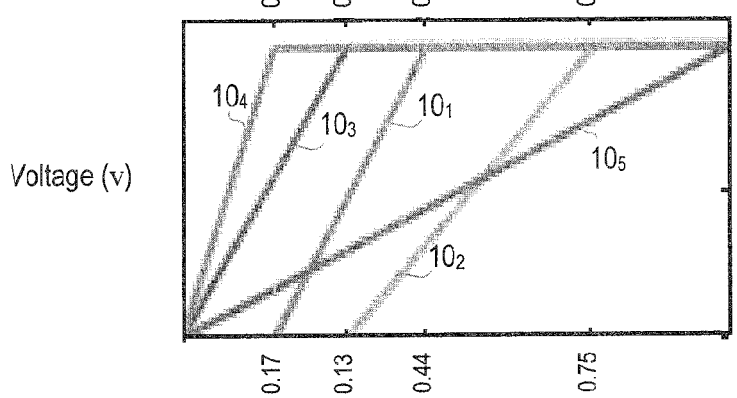

FIG. 9c shows the voltages of the respective amplifier stages $10_1$ to $10_5$ relative to full output amplitude.

Figure 9D:
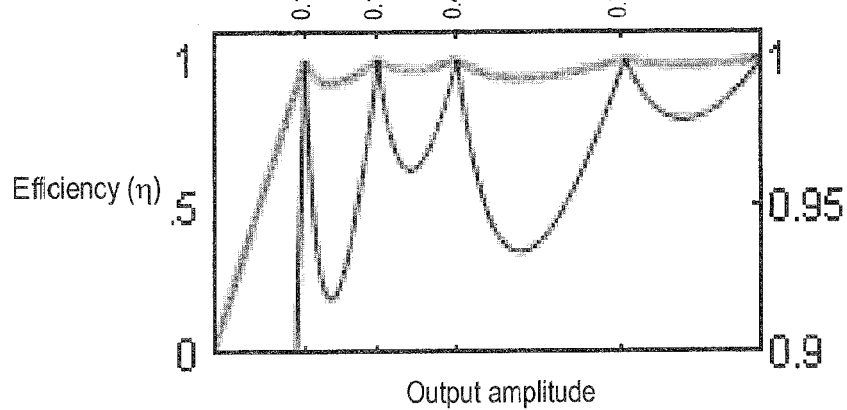

Referring to FIG. 9d, the efficiency curve for an amplifier designed for four equal size transistors, and one half sized transistor as shown in FIG. 9a, has peaks at 0.17, 0.3, 0.44, 0.75 and 1 of full output amplitude. This distribution of transition points is advantageous for high-PAR signals, and better that the prior art solutions for all relevant Rayleigh PAR values. Thus, compared with the plot of FIG. 6d, it can be seen that the peaks for the efficiency curves are more evenly distributed. The advantages of this are as follows The efficiency curve is pinned to the maximum at the transition points, giving efficiency peaks. The closer the peaks are, the less the efficiency curve dips between them. However, if two peaks are placed too close together, they will pull up the efficiency curve at that point, but not more than one efficiency peak alone would do. At the same time the dips outside them will be lowered, again to what we would have for a single peak. Even distributions of transition points are therefore more economical in getting good average efficiency with the least number of transistors. Apart from evenness, it is also beneficial that the points should also be closer in regions where the signal amplitude spends most time, for example usually in a fairly broad region around the amplitude corresponding to the average output power.

Figure 10:
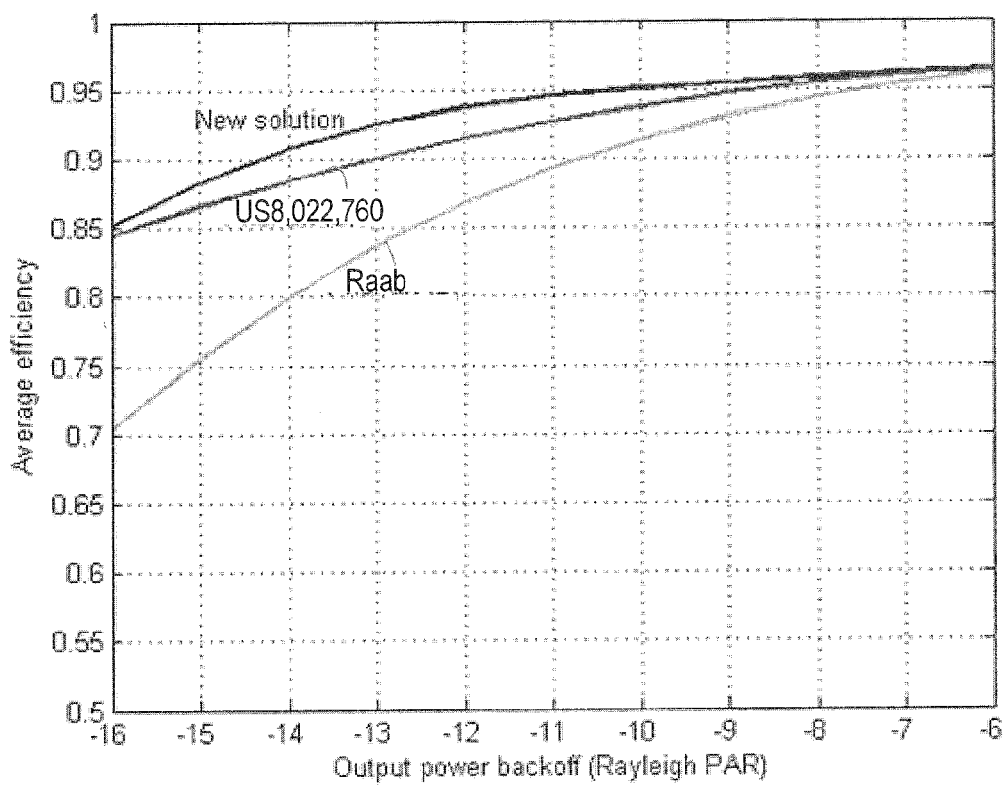
FIG. 10 compares average efficiency between an embodiment of the present invention and prior art solutions.

FIG. 10 shows a comparison of efficiency between the solution of FIG. 9a and the best prior art solutions from Raab and U.S. Pat. No. 8,022,760, all with optimal choice of amplifier sizes from the same pool of two sizes, to minimize the total loss power for an dB-equal distribution of Rayleigh signals with PAR values between 6 and 16 dB. The invention is better also for maximizing the minimum average efficiency within a PAR range that does not go too high, for example 6-20 dB PAR.

The distribution of the efficiency peaks of other embodiments may also be improved in this manner. For example, with reference to the embodiments of FIGS. 7a and 8a, just as with the 5-stage amplifier above, these 6-stage amplifiers too can have much better distributions of transition points if as little as two different sizes of transistors are used. Examples of this are shown below in FIGS. 11 and 12 for transistor sizes in a 2-to-1 relationship.

Figure 11A:
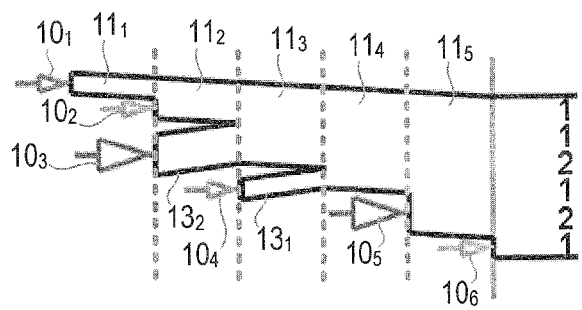
FIG. 11a shows an amplifier arrangement according to an embodiment of the present invention.

Referring to FIG. 11a, it shows an example of an amplifier arrangement comprising six amplifier stages $10_1$ to $10_6$, i.e. N=6, according to an embodiment of the invention.

The amplifier arrangement comprises a cascade of quarter wavelength transmission lines $11_1$ to $11_5$ coupled between an output of an amplifier of a first amplifier stage $10_1$ and an output node 15 of the amplifier arrangement. The cascade comprises five (N−1) quarter wavelength transmission lines $11_1$ to $11_5$ of decreasing characteristic impedance towards the output node.

The first and second amplifiers $10_1$ and $10_2$ are coupled directly to their respective junctions of the cascade of quarter wavelength transmission lines $11_1$ to $11_5$. However, for the remaining amplifiers ($10_3$ to $10_6$), they are coupled to their respective junctions of the cascade of quarter wavelength transmission lines such that successive pairs of amplifiers are either coupled via respective connecting quarter wavelength transmission lines 13 to their respective junctions, or coupled directly to their respective junctions. In this particular example of FIG. 11a, a first pair of amplifiers $10_3$ and $10_4$ are coupled via connecting quarter wavelength lines 13 to their respective junctions in the cascade of quarter wavelength transmission lines, with a second pair (the succeeding pair) of amplifiers $10_5$ and $10_6$ being connected directly (or equivalently, by half wavelengths) to the cascade of quarter wavelength transmission lines.

In contrast to FIG. 7a, however, in this embodiment of FIG. 11a one of the amplifiers from an amplifier pair, i.e. amplifier $10_3$ from the pair $10_3/10_4$, is increased in size compared to the other amplifier in the pair. It will be noted that, in this particular example, the amplifier $10_3$ is also increased in size compared to the other amplifiers, such as amplifiers $10_1$, $10_2$ and $10_6$. In this example, it is noted that one of the amplifiers from another amplifier pair, i.e. amplifier $10_5$ from the succeeding amplifier pair $10_5/10_6$, is also increased in size compared to the other amplifier in the pair. Although this example shows one amplifier from each pair being increased in size, it is noted that benefits may also be achieved from only increasing the amplifier from one pair. Alternatively, benefits may also be achieved with both amplifiers from one pair being increased, or both amplifiers from both pairs being increased.

A characteristic impedance of a connecting quarter wavelength transmission line 13 connecting the increased size amplifier $10_3$ to its respective junction of the cascade of quarter wavelength transmission lines is decreased compared to the characteristic impedance of the connecting quarter wavelength transmission line 13 connecting the other amplifier $10_4$ of the amplifier pair to its respective junction of the cascade of quarter wavelength transmission lines.

In the example of FIG. 11a the amplifier $10_3$ is doubled in size compared to the amplifier $10_4$, with the characteristic impedance of the connecting quarter wavelength transmission line 13 halved compared to the other. Alternatively, amplifier $10_4$ may be doubled in size compared to the amplifier $10_3$, with the characteristic impedance of the connecting quarter wavelength transmission line 13 halved compared to the other, i.e. vice versa to that shown in FIG. 11a.

Likewise, a characteristic impedance of a quarter wavelength transmission line in the cascade of a quarter wavelength transmission lines, to which the increased size amplifier $10_5$ is coupled, is decreased compared to the characteristic impedance of quarter wavelength transmission line to which the other amplifier $10_6$ of the amplifier pair is coupled. In the example of FIG. 11a the amplifier $10_5$ is doubled in size compared to the amplifier $10_6$, with the characteristic impedance of the corresponding quarter wavelength transmission line halved compared to the other. Alternatively, the amplifier $10_6$ may be doubled in size compared to the amplifier $10_5$, with the characteristic impedance of the corresponding quarter wavelength transmission line halved compared to the other, i.e. vice versa to that shown in FIG. 11a.

Figure 11B:
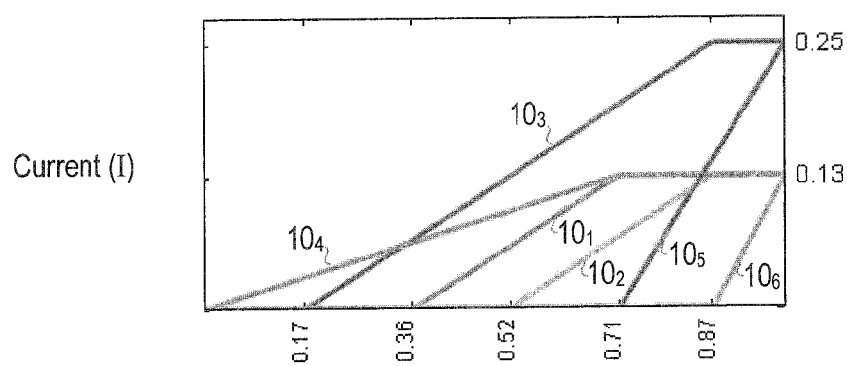

FIG. 11b shows a plot of current against output amplitude for the six-stage embodiment of the present invention as shown in FIG. 11a. The order of the amplifier starting points in this example is amplifier $10_4$ starting at zero, amplifier $10_3$ starting at 0.17 of full output amplitude, amplifier $10_1$ starting at 0.36 of full output amplitude, amplifier $10_2$ starting at 0.52 of full output amplitude, amplifier $10_5$ starting at 0.71 of full output amplitude, and amplifier $10_6$ starting at 0.87 of full output amplitude.

Figure 11C:
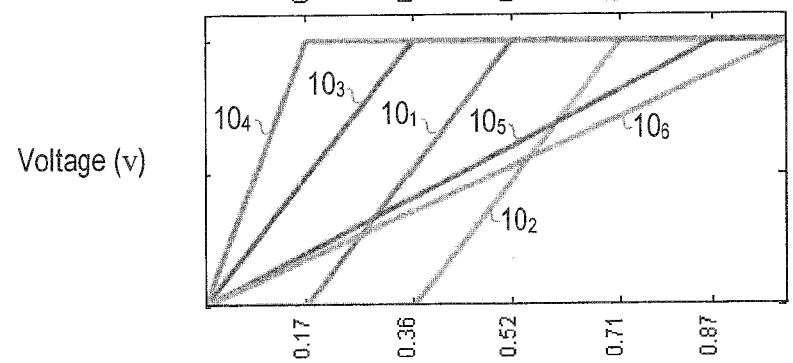

FIG. 11c shows the voltages of the respective amplifier stages $10_1$ to $10_6$ relative to full output amplitude.

Figure 11D:
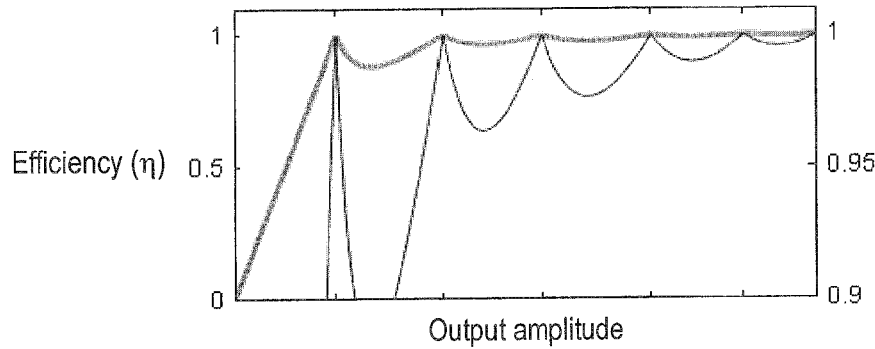

Referring to FIG. 11d, the efficiency curve for an amplifier designed for four equal size transistors and two increased sized transistors, as shown in FIG. 11a, has peaks at 0.17, 0.36, 0.52, 0.71, 0.87 and 1 of full output amplitude. This distribution of transition points is advantageous for high-PAR signals, and better that the prior art solutions for all relevant Rayleigh PAR values.

Figure 12A:
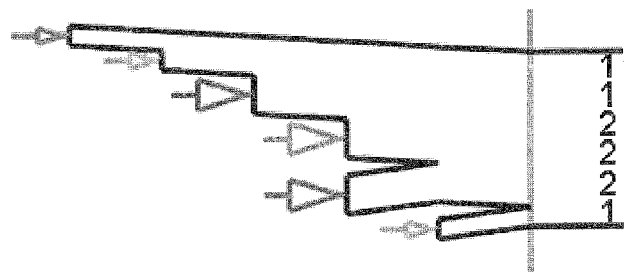
FIG. 12a shows an amplifier arrangement according to an embodiment of the present invention.

Referring in more detail to FIG. 12a, it shows another example of an amplifier arrangement comprising six amplifier stages $10_1$ to $10_6$, i.e. N=6, according to an embodiment of the invention.

The amplifier arrangement comprises a cascade of quarter wavelength transmission lines $11_1$ to $11_5$ coupled between an output of an amplifier of a first amplifier stage $10_1$ and an output node 15 of the amplifier arrangement. The cascade comprises five (N–1) quarter wavelength transmission lines $11_1$ to $11_5$ of decreasing characteristic impedance towards the output node.

The first and second amplifiers $10_1$ and $10_2$ are coupled directly to their respective junctions of the cascade of quarter wavelength transmission lines $11_1$ to $11_5$. However, for the remaining amplifiers ($10_3$ to $10_6$), they are coupled to their respective junctions of the cascade of quarter wavelength transmission lines such that successive pairs of amplifiers are either coupled via respective connecting quarter wavelength transmission lines 13 to their respective junctions, or coupled directly to their respective junctions. In this particular example of FIG. 12a, a first pair of amplifiers $10_3$ and $10_4$ are connected directly (or equivalently, by half wavelengths) to the cascade of quarter wavelength transmission lines, while a second pair (the succeeding pair) of amplifiers $10_5$ and $10_6$ are coupled via connecting quarter wavelength transmission lines 13.

In contrast to FIG. 8a, however, in this embodiment of FIG. 12a one of the amplifiers from an amplifier pair, i.e. amplifier $10_5$ from the pair $10_5/10_6$, is increased in size compared to the other amplifier in the pair. It will be noted that, in this particular example, the amplifier $10_5$ is also increased in size compared to some of the other amplifiers, such as amplifiers $10_1$, $10_2$ and $10_6$. In this example, it is noted that both the amplifiers from another amplifier pair, i.e. amplifiers $10_3$ and $10_4$, are also increased in size. Although this example shows one amplifier from one pair, and both amplifiers from another pair being increased in size, it is noted that benefits may also be achieved from only increasing one amplifier from each pair, or increasing both amplifiers from both pairs. It is noted that different dimensioning will suit different amplitude distributions, and the examples provided herein are for distributions that often occur in base stations for mobile telephony. In such applications there is often a combination of a short-term distribution (changes on a timescale corresponding to the many tens of MHz bandwidth that the signal occupies) that is a Rayleigh distribution with 5-8 dB PAR, and a long term distribution that depends on changing traffic patterns over the day that adds some extra dB of PAR. As such, a 8-14 dB or 8 and 14 dB sum of distribution can be used to compare efficiency in a meaningful way.

Thus, according to an embodiment of the invention, one amplifier of an amplifier pair may be reduced or increased in size compared to the other amplifier of the amplifier pair, and wherein a characteristic impedance of a corresponding quarter wavelength transmission line is increased or decreased, respectively, compared to the characteristic impedance of the quarter wavelength transmission line associated with the other amplifier in the amplifier pair.

In addition, first and second amplifiers of at least one amplifier pair may be reduced or increased in size compared to the other amplifiers of the amplifier arrangement, and wherein a characteristic impedance of corresponding quarter wavelength transmission lines of the amplifier pair are increased or decreased, respectively, compared to the characteristic impedance of the quarter wavelength transmission lines associated with the other amplifiers in the amplifier arrangement.

Figure 12B:
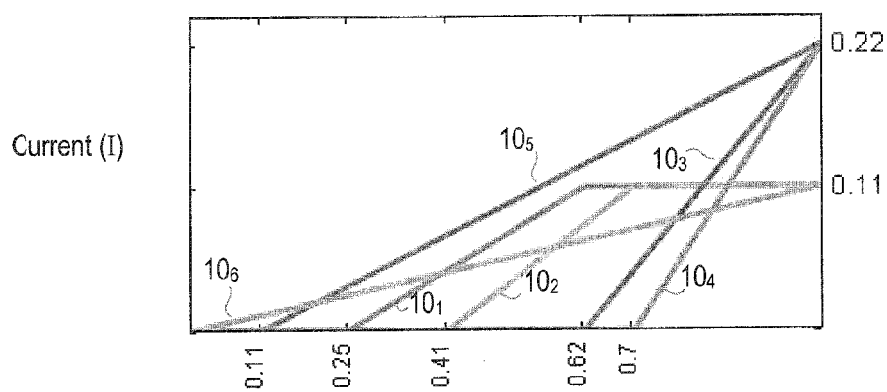

FIG. 12b shows a plot of current against output amplitude for the six-stage embodiment of the present invention as shown in FIG. 12a. The order of the amplifier starting points in this example is amplifier $10_6$ starting at zero, amplifier $10_5$ starting at 0.11 of full output amplitude, amplifier $10_1$ starting at 0.25 of full output amplitude, amplifier $10_2$ starting at 0.41 of full output amplitude, amplifier $10_3$ starting at 0.62 of full output amplitude, and amplifier $10_4$ starting at 0.7 of full output amplitude.

The current amplitudes are zero below, and (piecewise) linear above respective transition points (and zero). The current amplitudes of three of the amplifiers (amplifiers $10_5$, $10_3$ and $10_4$) are then linear up to the maximum output, one amplifier $10_6$ linear up to the maximum output (but at a lower current), and two (amplifiers $10_1$ and $10_2$) limited to the same amplitude as each other at certain transition points. This amplifier arrangement thus has two amplitude-limiting points, thus requiring two limiting circuits.

Figure 12C:
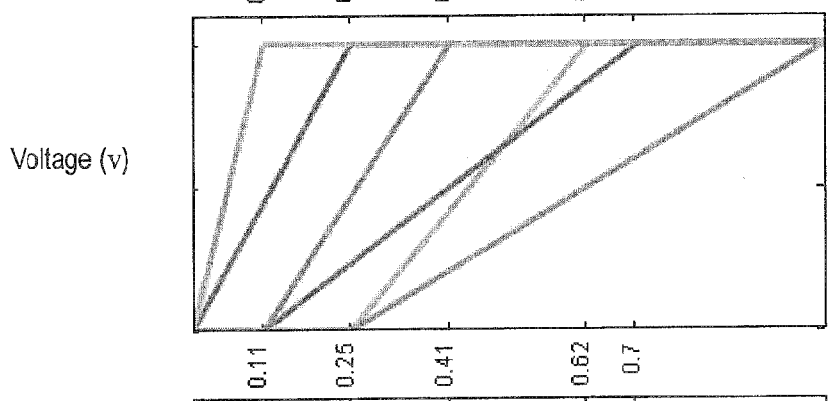

FIG. 12c shows the voltages of the respective amplifier stages $10_1$ to $10_6$ relative to full output amplitude.

Figure 12D:
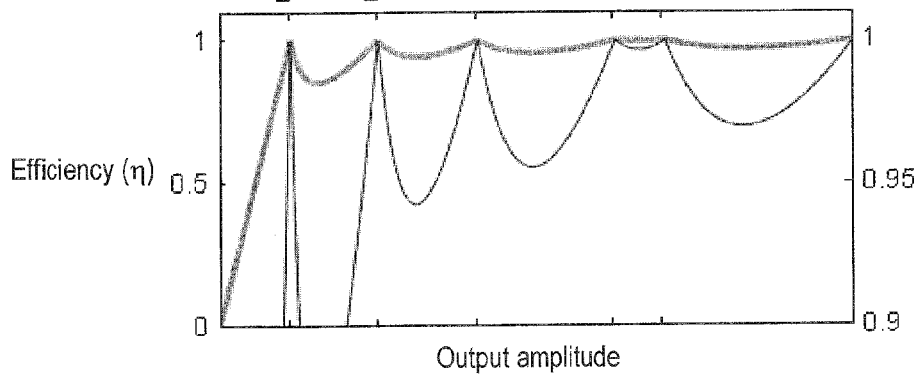
Figure 13A:
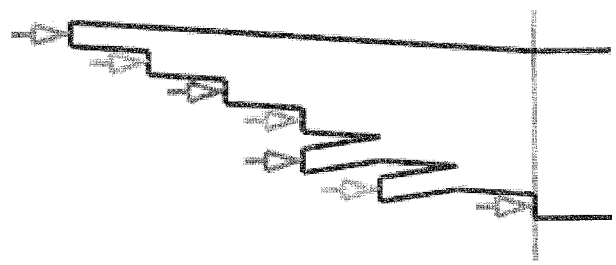
FIG. 13a shows an amplifier arrangement according to an embodiment of the present invention.
Figure 13B:
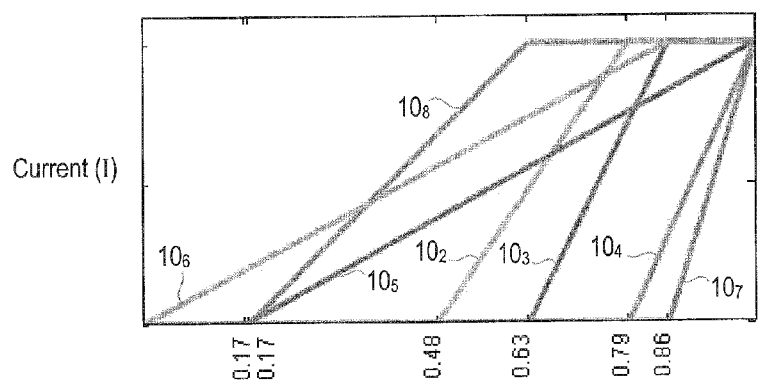
Figure 13C:
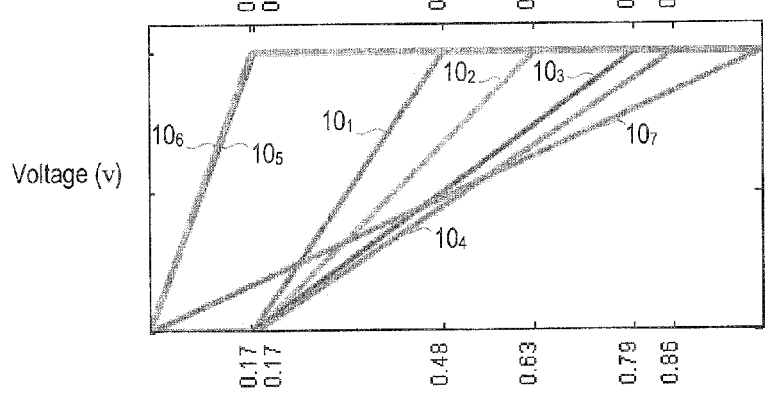
Figure 13D:
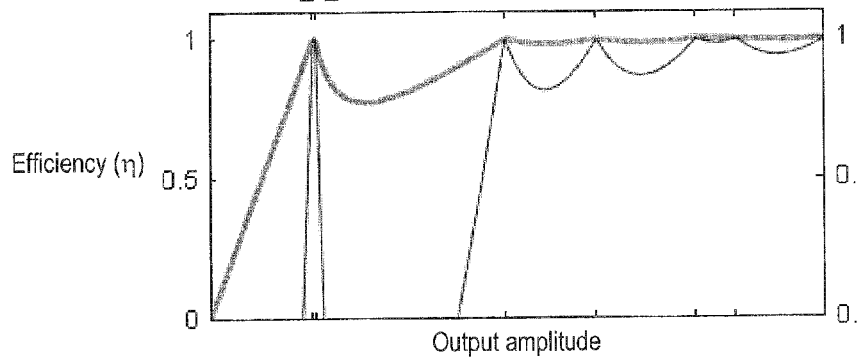

Referring to FIG. 12d, the efficiency curve for an amplifier designed for four equal size transistors, and three increased sized transistors, has peaks at 0.11, 0.25, 0.41, 0.62, 0.7 and 1 of full output amplitude. This distribution of transition points is advantageous for high-PAR signals, and better that the prior art solutions for all relevant Rayleigh PAR values.

For a 7-stage amplifier arrangement there are five different embodiments when amplifiers of the same size are used, as explained below in relation to FIGS. 13 to 17. It is noted, however, that varying the size of one or more amplifiers (and corresponding quarter wavelength transmission lines) may also be applied to the embodiments of these Figures, although this is not described with reference to FIGS. 13 to 17 for ease of clarity.

FIGS. 13a to 13d relate to an embodiment of a 7-stage amplifier whereby amplifiers $10_3$ and $10_4$ are connected directly to the cascade of quarter wavelength transmission lines, and amplifiers $10_5$ and $10_6$ coupled via connecting quarter wavelength transmission lines 13, and amplifier $10_7$ coupled directly. It is noted that, in FIG. 13c, there a two transition points which are very close at 0.17 of full amplitude, such that the voltage trace of amplifier $10_5$ lies just a little to the right of that of amplifier $10_6$.

FIGS. 14a to 14d relate to an embodiment of a 7-stage amplifier whereby amplifiers $10_3$ and $10_4$ are coupled via connecting quarter wavelength transmission lines 13 to the cascade of quarter wavelength transmission lines, and amplifiers $10_5$ and $10_6$ coupled directly, and amplifier $10_7$ coupled via a connecting quarter wavelength transmission line. It is noted that, in FIG. 14b, the two currents from amplifiers $10_5$ and $10_6$ both start at about 0.83 of full amplitude.

FIGS. 15a to 15d relate to an embodiment of a 7-stage amplifier whereby amplifiers $10_3$ and $10_4$ are coupled via connecting quarter wavelength transmission lines 13 to the cascade of quarter wavelength transmission lines, and amplifiers $10_5$ and $10_6$ coupled directly, and amplifier $10_7$ coupled directly.

FIGS. 16a to 16d relate to an embodiment of a 7-stage amplifier whereby amplifiers $10_3$ and $10_4$ are connected directly to the cascade of quarter wavelength transmission lines, and amplifiers $10_5$ and $10_6$ coupled via connecting quarter wavelength transmission lines 13, and amplifier $10_7$ coupled via a connecting quarter wavelength transmission line.

FIGS. 17a to 17d relate to a final embodiment of a 7-stage amplifier whereby amplifiers $10_3$ and $10_4$ are connected via connecting quarter wavelength transmission lines 13 to the cascade of quarter wavelength transmission lines, and amplifiers $10_5$ and $10_6$ coupled via connecting quarter wavelength transmission lines 13, and amplifier $10_7$ coupled directly. It is noted that, in FIG. 17c, there a two transition points which are very close at 0.17 of full amplitude, such that the voltage trace of amplifier $10_5$ lies just a little to the right of that of amplifier $10_6$.

As mentioned above, it is noted that the transition points in each of these 7-stage amplifier embodiments shown in FIGS. 13 to 17 can also be improved yet further by using two different sizes of transistors, as described above with reference to FIGS. 9, 11 and 12. Three examples of distributions of transition points that are good for high-PAR signals when using two transistor sizes in a 2-to-1 relationship are shown below in FIGS. 18, 19 and 20.

Figure 17A:
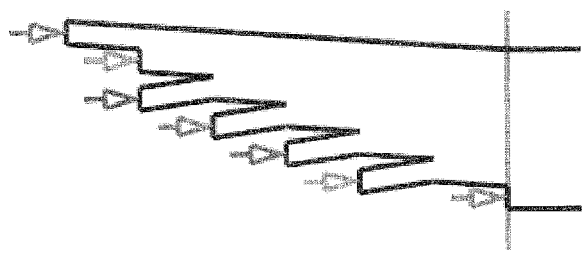
FIG. 17a shows an amplifier arrangement according to an embodiment of the present invention.
Figure 17B:
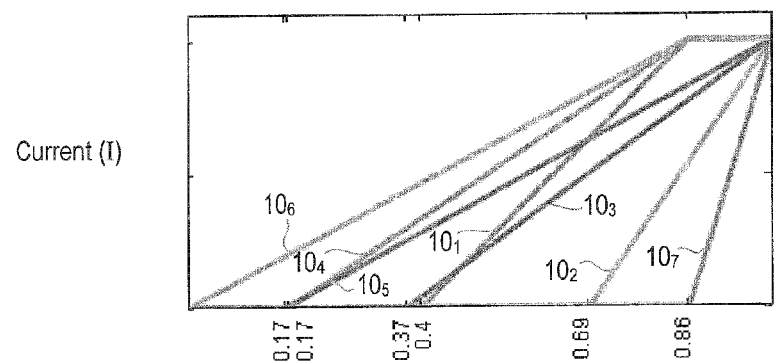
Figure 17C:
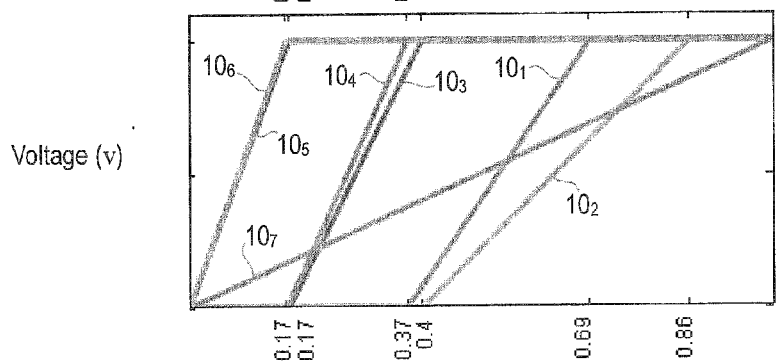
Figure 17D:
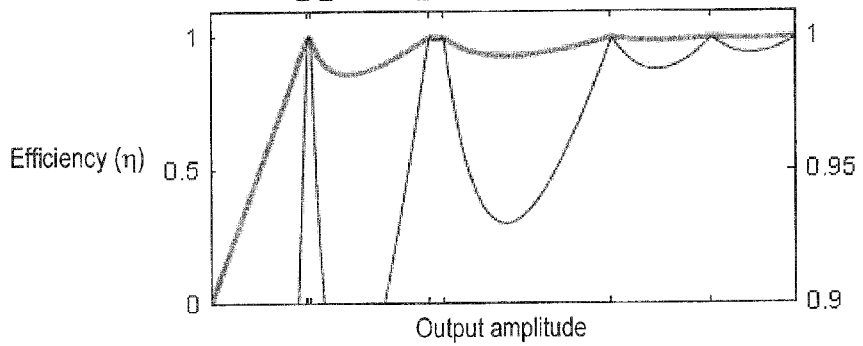
Figure 18A:
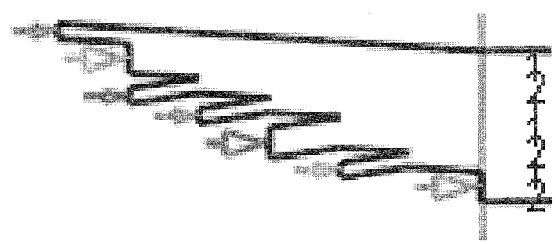
FIG. 18a shows an amplifier arrangement according to an embodiment of the present invention.
Figure 18B:
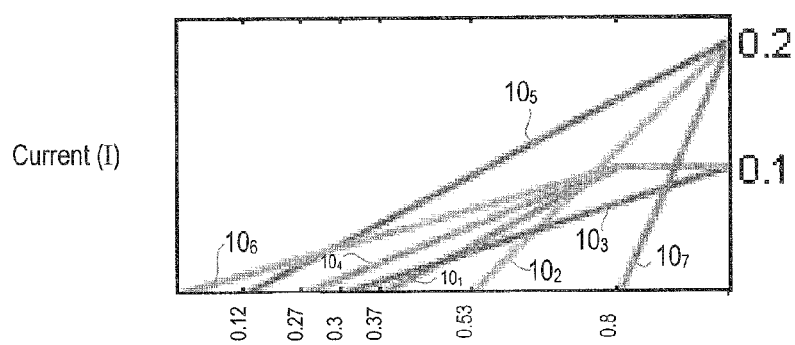
Figure 18C:
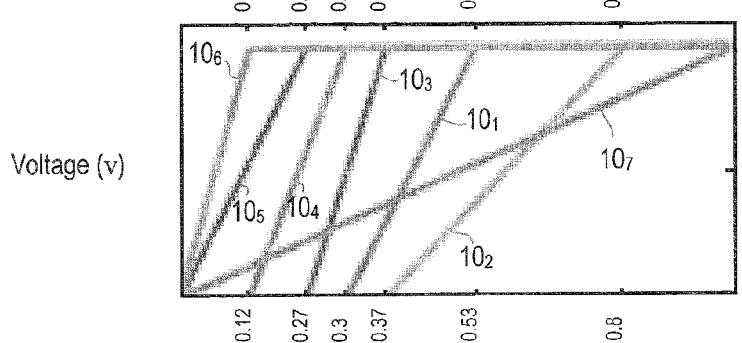
Figure 18D:
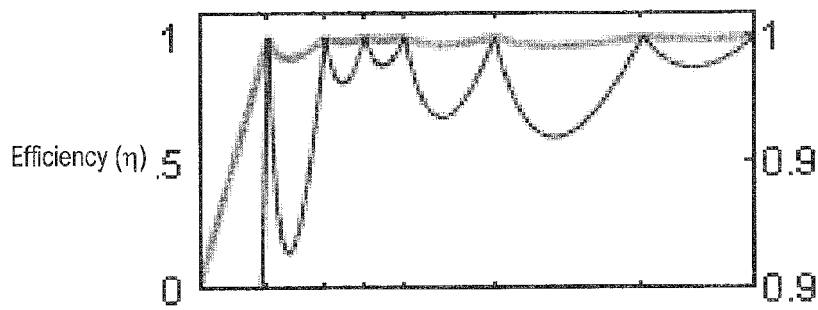
Figure 19A:
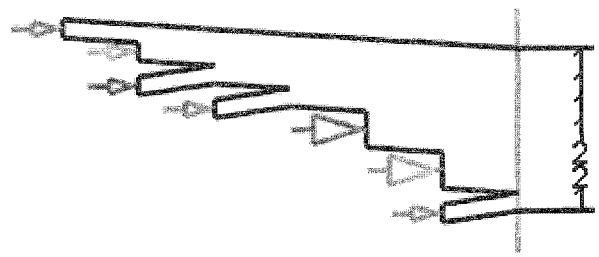
FIG. 19a shows an amplifier arrangement according to an embodiment of the present invention.
Figure 19B:
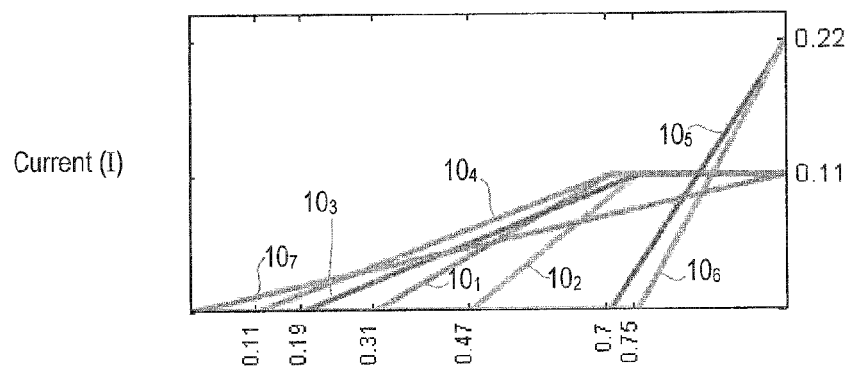
Figure 19C:
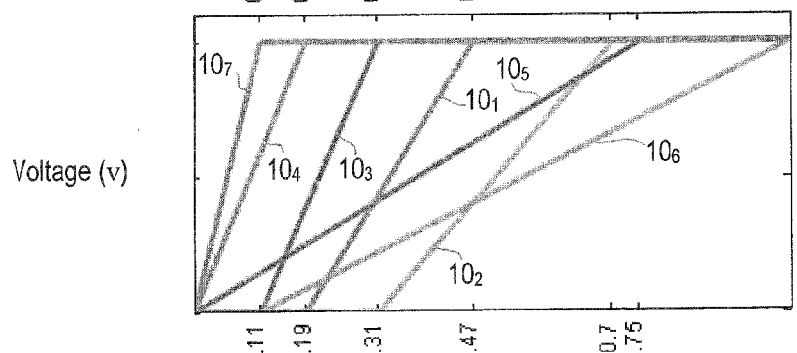
Figure 19D:
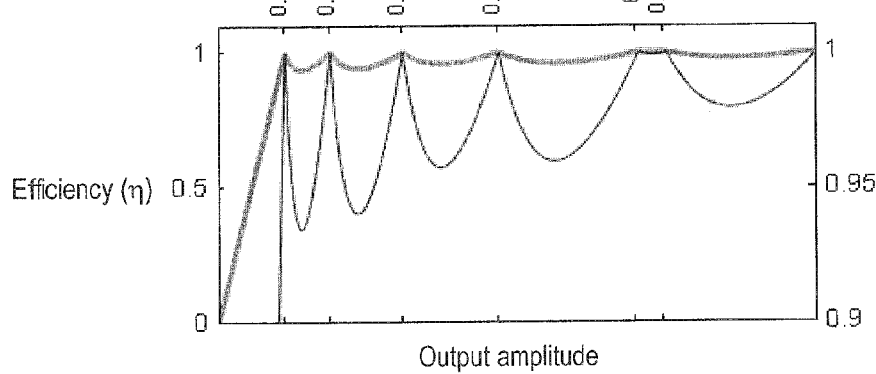
Figure 20A:
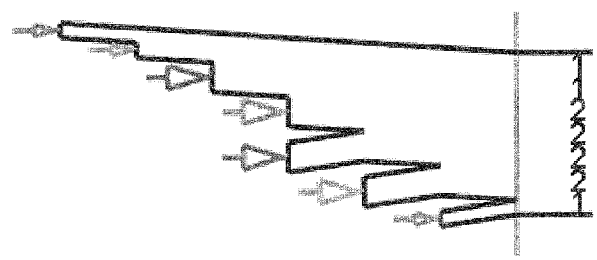
FIG. 20a shows an amplifier arrangement according to an embodiment of the present invention.
Figure 20B:
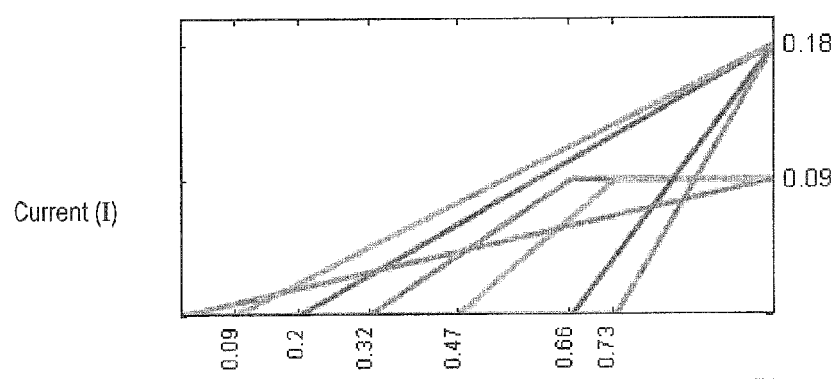
Figure 20C:
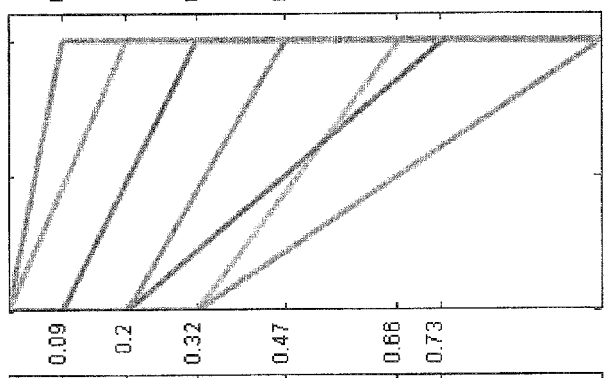
Figure 20D:
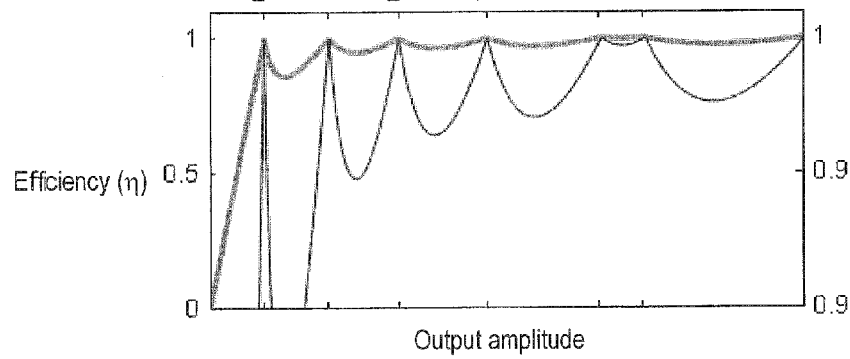
Figure 21A:
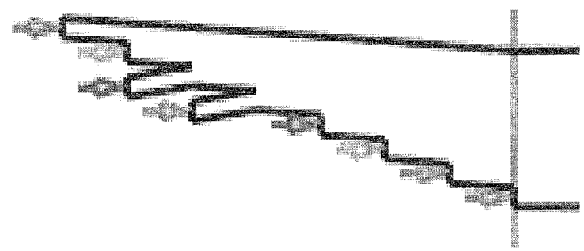
FIG. 21a shows an amplifier arrangement according to an embodiment of the present invention.
Figure 21B:
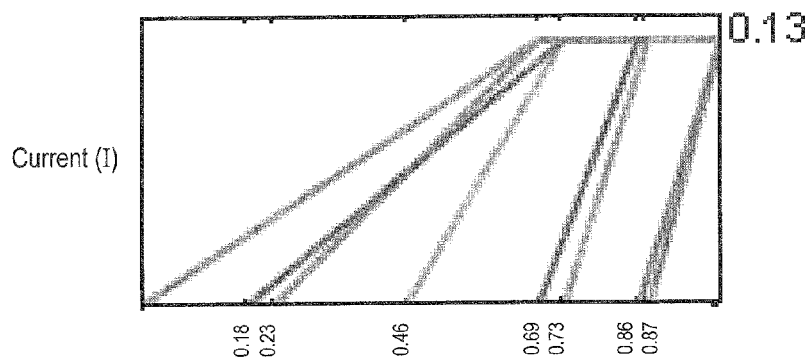
Figure 21C:
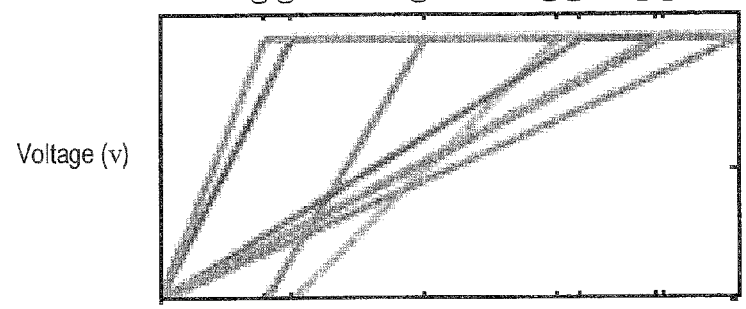
Figure 21D:
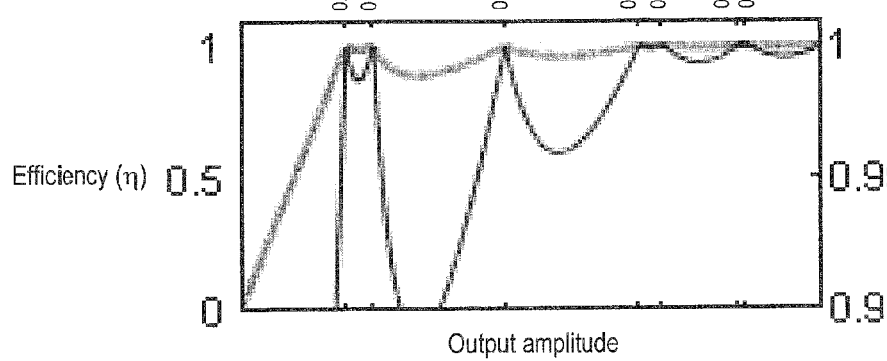
Figure 22A:
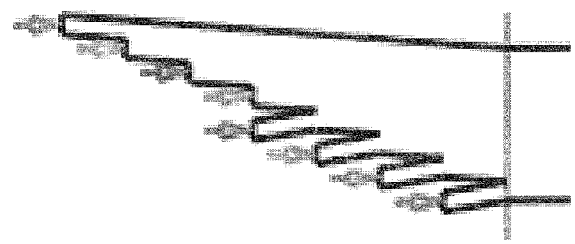
FIG. 22a shows an amplifier arrangement according to an embodiment of the present invention.
Figure 22B:
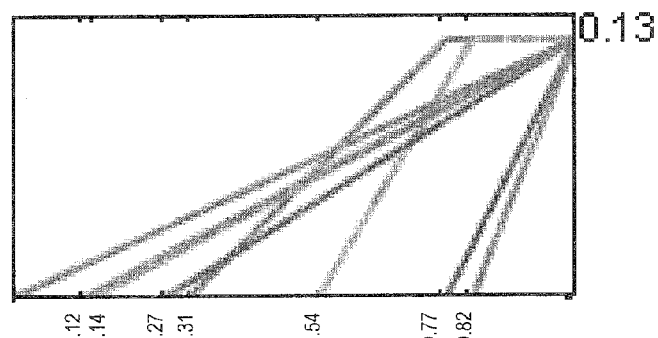
Figure 22C:
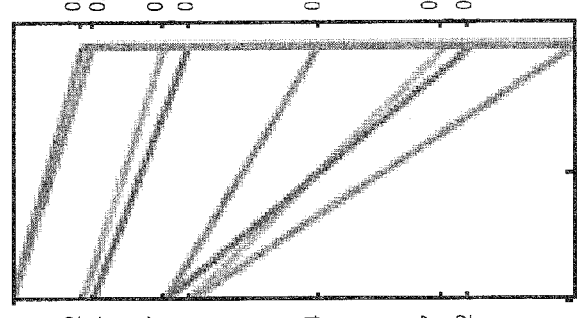
Figure 22D:
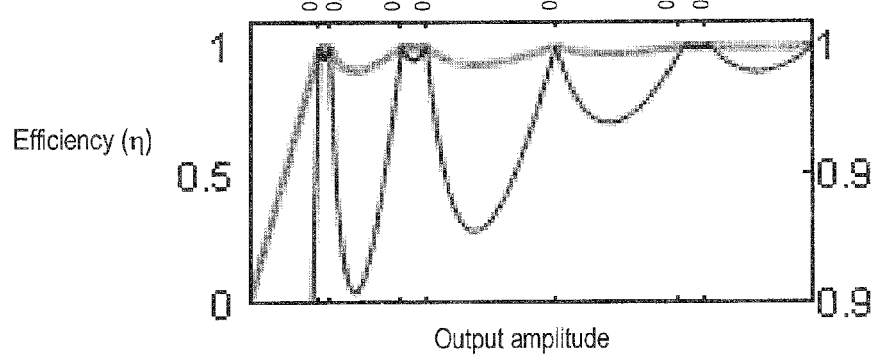
Figure 23A:
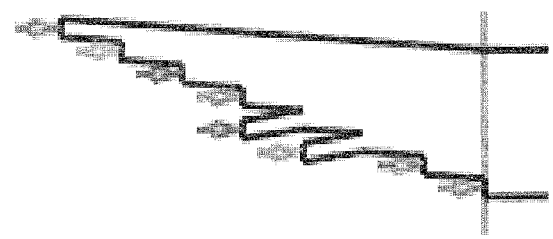
FIG. 23a shows an amplifier arrangement according to an embodiment of the present invention.
Figure 23B:
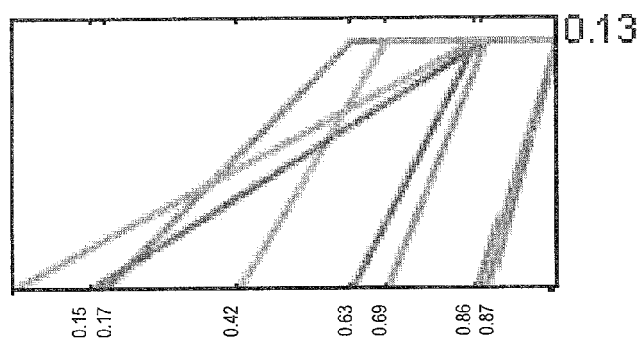
Figure 23C:
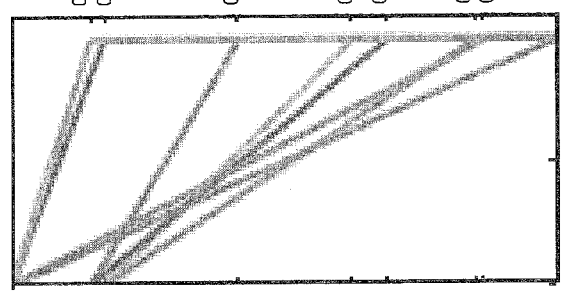
Figure 23D:
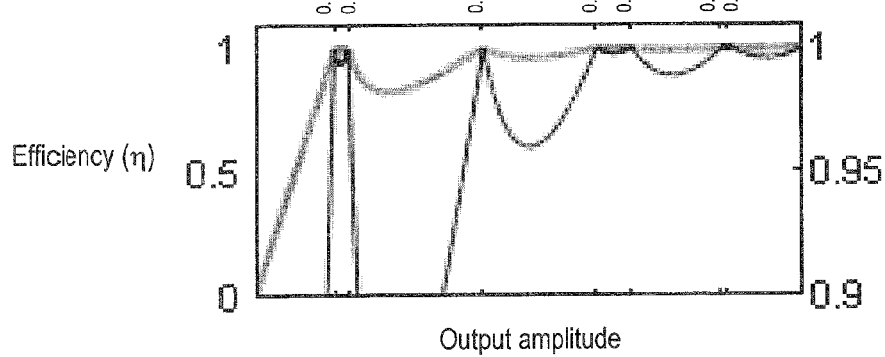
Figure 24A:
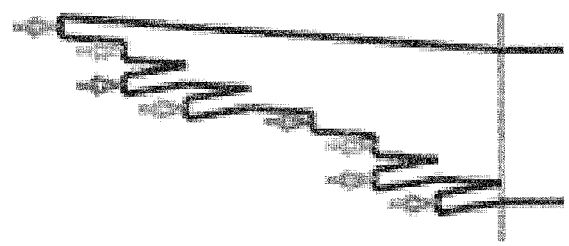
FIG. 24a shows an amplifier arrangement according to an embodiment of the present invention.
Figure 24B:
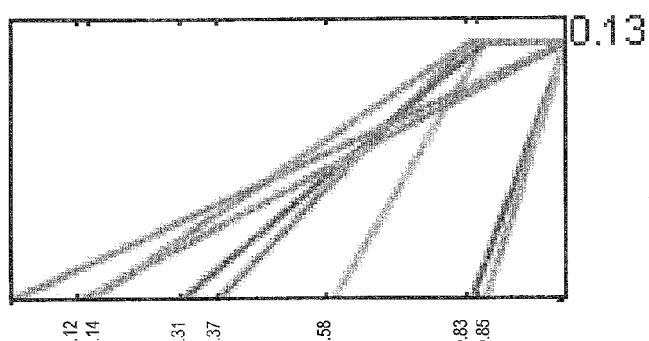
Figure 24C:
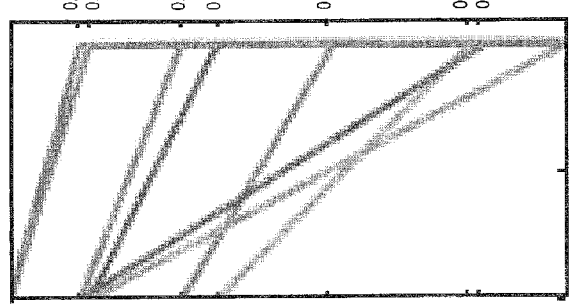
Figure 24D:
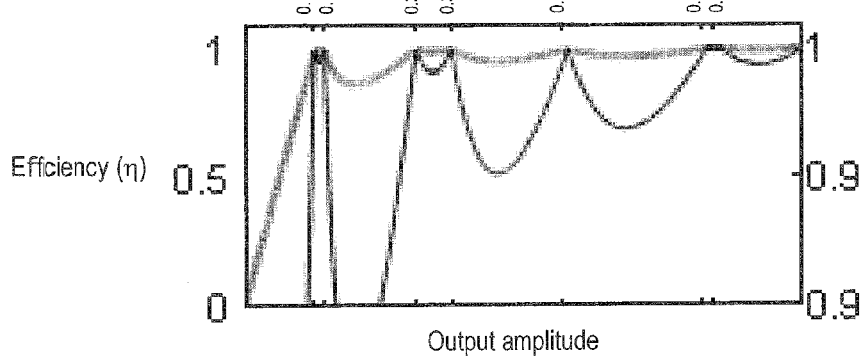
Figure 25A:
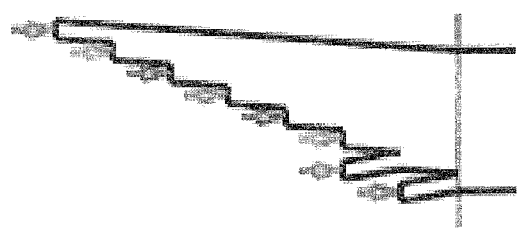
FIG. 25a shows an amplifier arrangement according to an embodiment of the present invention.
Figure 25B:
Figure 25C:
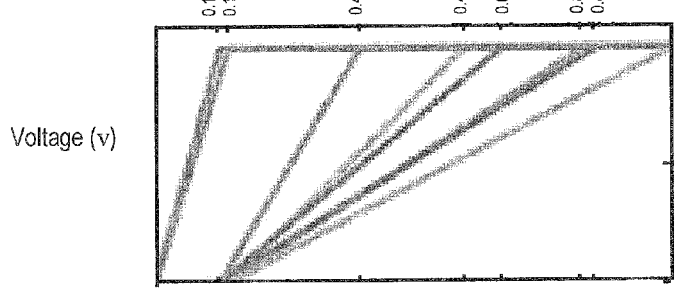
Figure 25D:
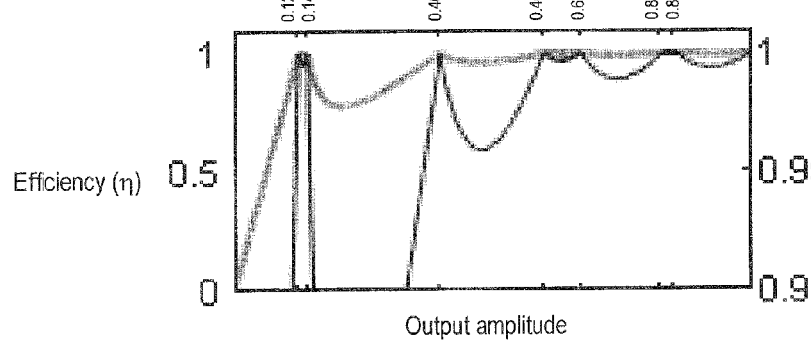
Figure 26A:
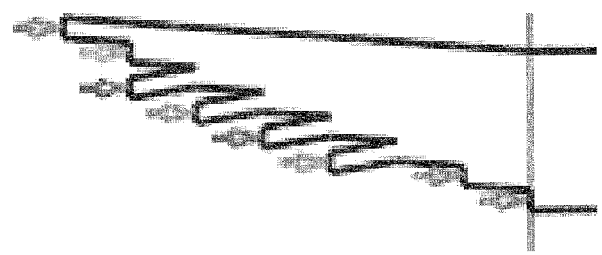
FIG. 26a shows an amplifier arrangement according to an embodiment of the present invention.
Figure 26B:
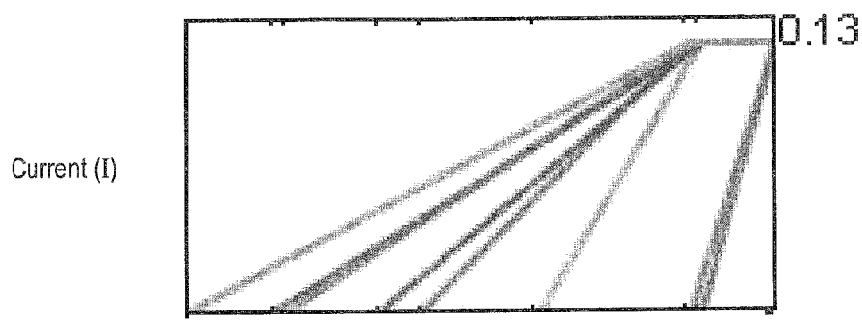
Figure 26C:
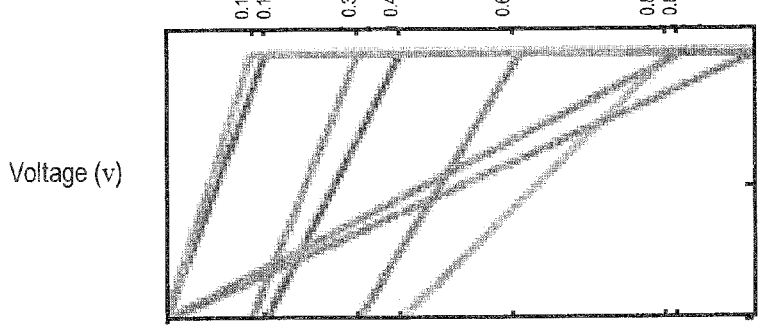
Figure 26D:
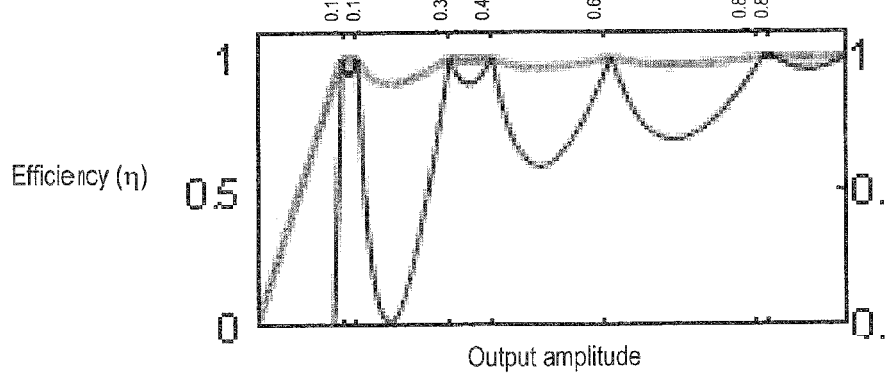

FIGS. 18a to 18d relate to an embodiment of a 7-stage amplifier whereby, similar to FIG. 17a, amplifiers $10_3$ and $10_4$ are connected via connecting quarter wavelength transmission lines 13 to the cascade of quarter wavelength transmission lines, and amplifiers $10_5$ and $10_6$ coupled via connecting quarter wavelength transmission lines 13, and amplifier $10_7$ coupled directly. However, unlike FIG. 17a in which all of the transistors are equally sized (and corresponding characteristic impedances equally sized), in the embodiment of FIG. 18a one of the amplifiers $10_5$ is increased compared to the others (for example doubled), and the characteristic impedance of its corresponding connecting quarter wavelength transmission line 13 reduced in size (for example halved). It is noted that one or more of the other amplifiers may also be increased in size, and a corresponding characteristic impedance of a quarter wavelength transmission line reduced, in any combination. For example, in FIG. 17a the amplifier $10_2$ is shown as being increased (and the characteristic impedance of the quarter wavelength transmission line in the cascade reduced in correspondence with this). In this example of FIG. 17a, the amplifier $10_7$ is also shown as being increased (and the characteristic impedance of the quarter wavelength transmission line in the cascade reduced in correspondence with this). Other combinations and variations are also intended to be covered by embodiments of the invention, as defined in the appended claims.

Figure 14A:
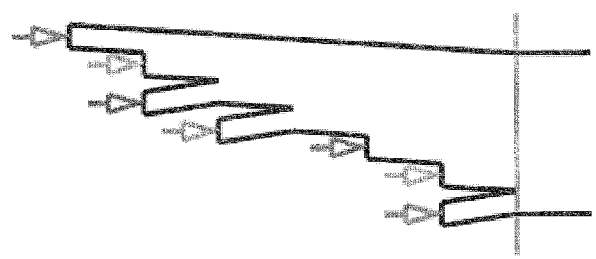
FIG. 14a shows an amplifier arrangement according to an embodiment of the present invention.
Figure 14B:
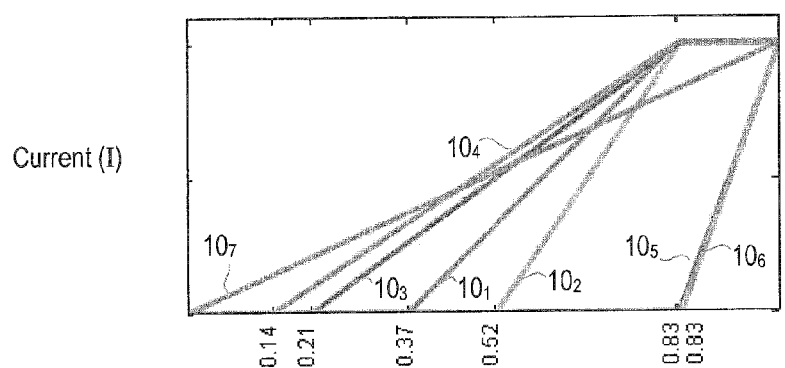
Figure 14C:
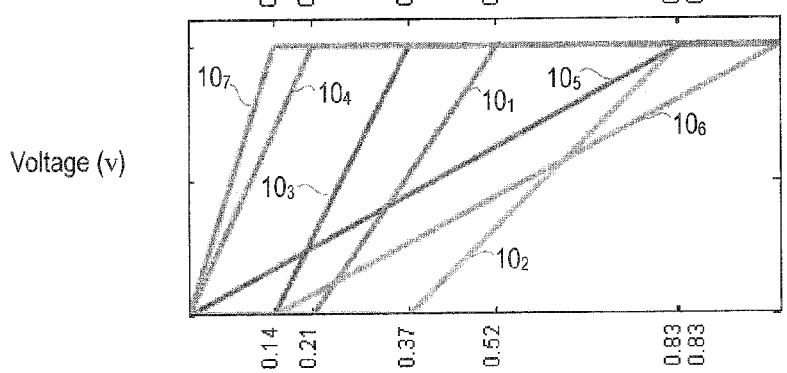
Figure 14D:
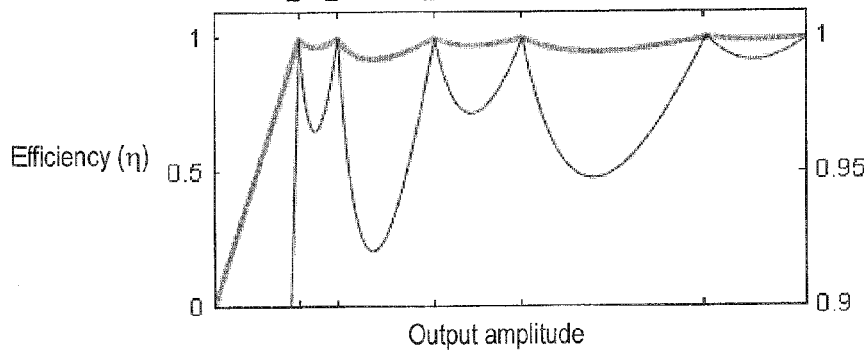
Figure 15A:
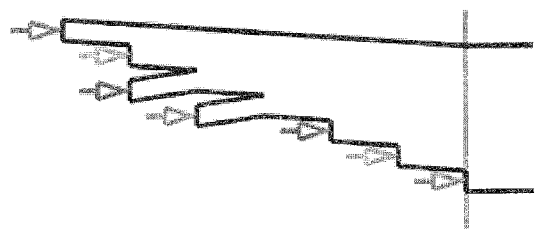
FIG. 15a shows an amplifier arrangement according to an embodiment of the present invention.
Figure 15B:
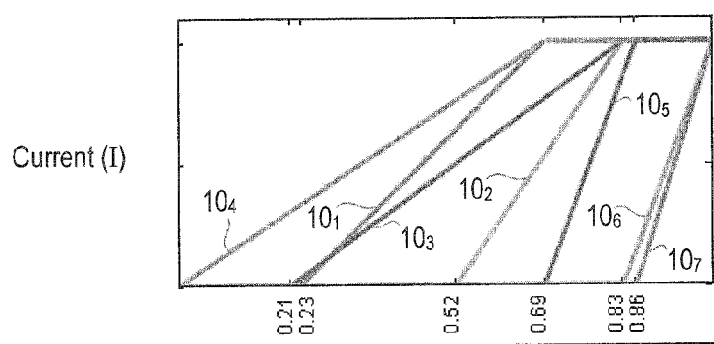
Figure 15C:
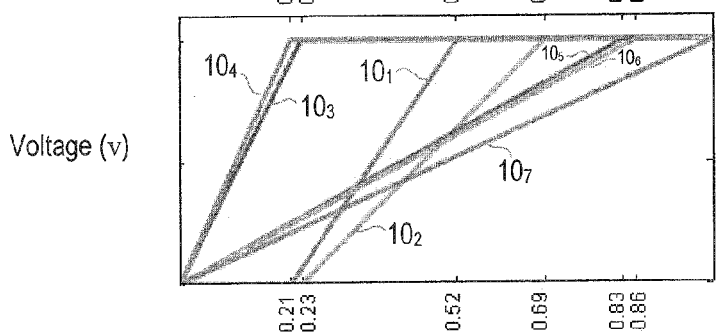
Figure 15D:
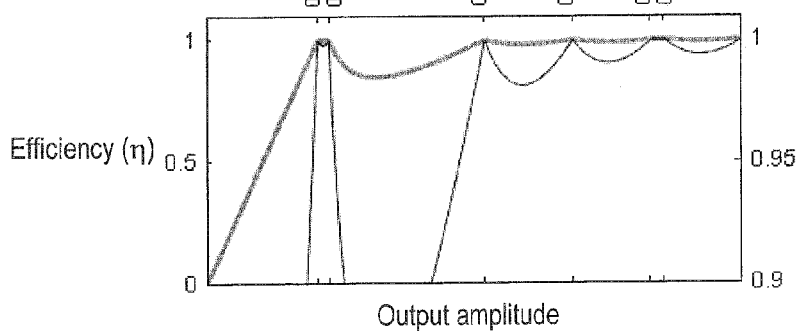

FIGS. 19a to 19d relate to an embodiment of a 7-stage amplifier whereby, similar to FIG. 14a, amplifiers $10_3$ and $10_4$ are coupled via connecting quarter wavelength transmission lines 13 to the cascade of quarter wavelength transmission lines, and amplifiers $10_5$ and $10_6$ coupled directly, and amplifier $10_7$ coupled via a connecting quarter wavelength transmission line. However, unlike FIG. 14a in which all of the transistors are equally sized (and corresponding characteristic impedances equally sized), in the embodiment of FIG. 19a the amplifiers $10_5$ and $10_6$ are increased compared to the others (for example doubled), and the characteristic impedance of their corresponding quarter wavelength transmission line cascade reduced in size (for example halved). It is noted that one or more of the other amplifiers may also be increased in size, and a corresponding characteristic impedance of a quarter wavelength transmission line reduced, in any combination.

Figure 16A:
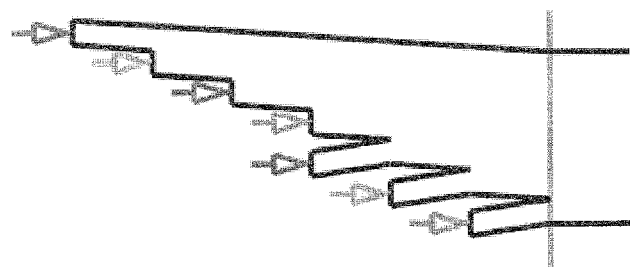
FIG. 16a shows an amplifier arrangement according to an embodiment of the present invention.
Figure 16B:
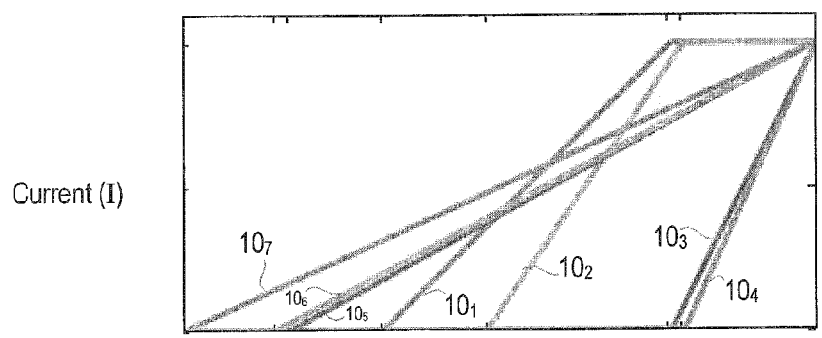
Figure 16C:
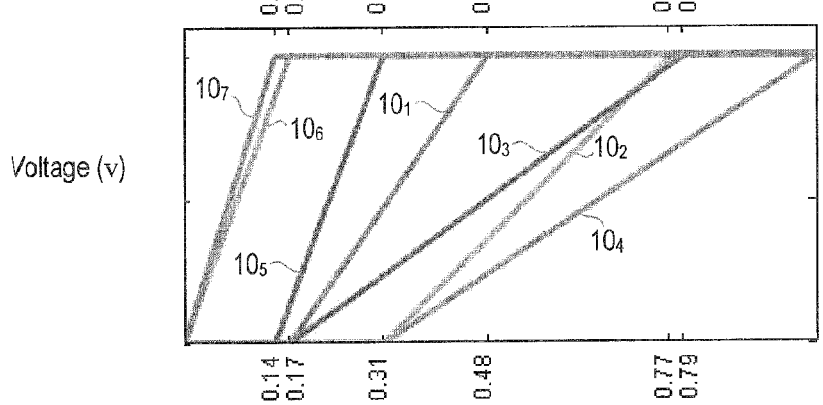
Figure 16D:
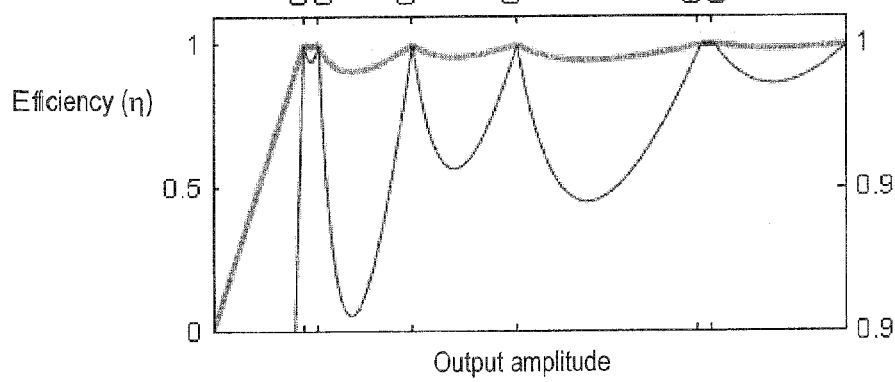

FIGS. 20a to 20d relate to an embodiment of a 7-stage amplifier whereby, similar to FIG. 16a, amplifiers $10_3$ and $10_4$ are connected directly to the cascade of quarter wavelength transmission lines, and amplifiers $10_5$ and $10_6$ coupled via connecting quarter wavelength transmission lines 13, and amplifier $10_7$ coupled via a connecting quarter wavelength transmission line. However, unlike FIG. 16a in which all of the transistors are equally sized (and corresponding characteristic impedances equally sized), in the embodiment of FIG. 20a the amplifiers $10_5$ and $10_6$ are increased compared to the others (for example doubled), and the characteristic impedance of their corresponding connecting quarter wavelength transmission lines 13 reduced in size (for example halved). It is noted that one or more of the other amplifiers may also be increased in size, and a corresponding characteristic impedance of a quarter wavelength transmission line reduced, in any combination.

The embodiments of the present invention are generally expandable to higher-stage amplifier embodiments.

FIGS. 21 to 26 illustrate examples of embodiments of the invention relating to an 8-stage amplifier arrangement. Although the embodiments of FIGS. 21 to 26 are described with transistors or amplifiers of equal size, it is noted that the transition points in each of these 8-stage amplifier embodiments shown in FIGS. 21 to 26 can also be improved yet further by using two different sizes of transistors, as described above with reference to FIGS. 9, 11 and 12.

It can be seen from the above that the embodiments of the invention thus perform generally better than prior art Doherty amplifiers in relation to average efficiency for high-PAR signals. It is noted that the relative advantage increases with increasing numbers of amplifier stages.

It is noted that in the embodiments described herein, any quarter wavelength transmission line can double as an impedance transformer, i.e. the impedance and corresponding maximum RF voltage swings can be individually adjusted for each transistor. This can be useful if one or more of the transistors are made with a different technology having a different voltage rating. It can also be beneficial to use these transformations to accommodate a different load impedance, instead of making this transformation outside of the Doherty amplifier which would require extra impedance transformers. Apart from these considerations, it is usually best to have as little extra impedance transformations as possible in the Doherty network, since this generally gives high bandwidth and low sensitivity.

Transistors in general act as controlled RF current sources, so the shape of the amplitudes and phases (relative to that of the output) of the RF currents as functions of the output amplitude also suggest the shaping that must be performed to the input signals to the transistors, i.e. the gate drive voltages. The actual shapes may have to take into account that the voltage-to-current conversion (transconductance) in the transistors is more or less nonlinear, and that the RF voltage swing can influence the output current as well (especially via saturation when close to the upper limit).

Causing a transistor to turn on at a higher amplitude is often done by lowering the gate bias to the transistor, i.e. operating in class C. This means that less large-scale amplitude shaping needs to be done earlier in the processing chain, but usually at the cost of lower gain and lower maximum output power.

It is also noted that any of the transmission lines in the examples described herein can be wholly or partially replaced by combinations of lumped elements. For example, the quarterwave lines can be replaced by LC pi- or T-networks with inductors (L) and capacitors (C) with reactances equal in magnitude to the characteristic impedance of the replaced quarterwave line.

The embodiments of the invention provide advantageous Doherty amplifiers with five or more stages. For high PAR signals, the distribution of transition points when equal size transistors are used is improved compared to prior art Doherty amplifiers.

According to some embodiments, by simply halving the size of one transistor, and doubling the characteristic impedance of the corresponding quarterwave line, the efficiency peaks can be distributed even more evenly, which increases average efficiency for high-PAR signals. According to other embodiments, by changing the size of another transistor, the whole bunch of efficiency peaks can be moved to higher or lower amplitude ranges, with retained evenness. Good dimensioning is thus easily achieved.

Another advantageous property of the embodiments described herein is that the drive signal shaping is simple. In one embodiment, only different gains and different static gate biases are necessary.

Figure 27:
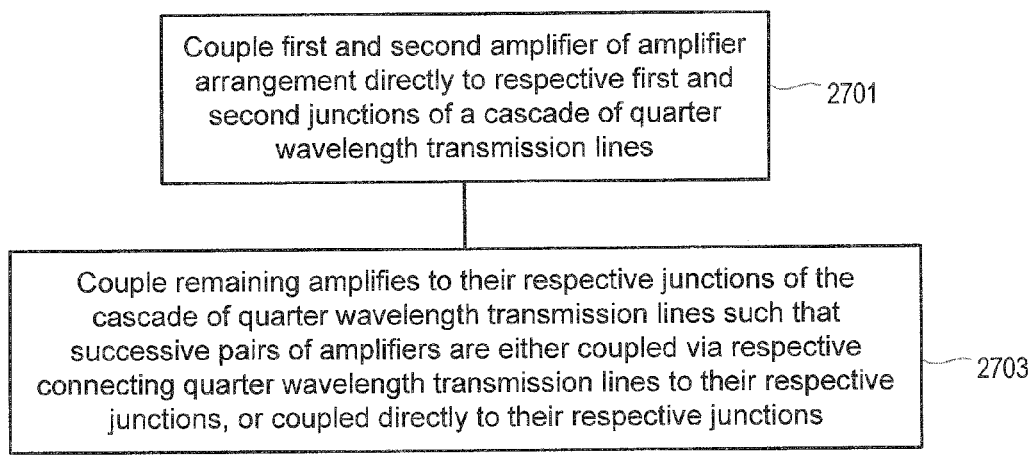
FIG. 27 shows a method according to another embodiment of the present invention.

FIG. 27 shows a method of improving the efficiency of an amplifier arrangement comprising N amplifier stages $10_1$ to $10_N$, wherein N is an integer equal or greater than five, wherein the amplifier arrangement comprises a cascade of quarter wavelength transmission lines coupled between an output of an amplifier of a first amplifier stage $10_1$ and an output node 15 of the amplifier arrangement, wherein the cascade comprises N−1 quarter wavelength transmission lines $11_1$ to $11_{N-1}$ of decreasing characteristic impedance towards the output node 15, and wherein an amplifier of the Nth stage $10_N$ is coupled to the output node 15, and remaining amplifiers between the first and Nth stages $10_1$ to $10_{N-1}$ coupled to successive junctions in the cascade of quarter wavelength transmission lines $11_1$ to $11_{N-1}$.

The method comprising the steps of coupling first and second amplifiers $10_1$ and $10_2$ to respective first and second junctions of the cascade of quarter wavelength transmission lines; and coupling the remaining amplifiers $10_3$ to $10_N$ to their respective junctions of the cascade of quarter wavelength transmission lines such that successive pairs of amplifiers are either coupled via respective connecting quarter wavelength transmission lines 13 to their respective junctions, or coupled directly to their respective junctions.

When the amplifier arrangement comprises an odd number of amplifier stages $10_1$ to $10_N$, then according to one embodiment the method comprises the step of coupling the Nth amplifier stage $10_N$ directly to the output node 15. Alternatively, when the amplifier arrangement comprises an odd number of amplifier stages $10_1$ to $10_N$, according to an embodiment the method comprises the step of coupling the Nth amplifier stage $10_N$ via a connecting quarter wavelength transmission line 13 to the output node 15.

Although some embodiments of the invention describe amplifier sizes being halved and corresponding characteristic impedances of quarter wavelength transmission lines being doubled, it is noted that other functions may be used.

The references to halved and doubled are provided as examples of practical implementations of different sized transistors or amplifiers, but that other different sizes may also be used without departing from the scope of the invention as defined in the appended claims. In other words, the values of increase and decrease given in the embodiments herein are examples only, and that variations can be made without departing from the invention as defined in the appended claims.

It is also noted that the characteristic impedance of a transmission line is represented by the comparative thickness of a transmission lines.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier arrangement comprising N amplifier stages, wherein N is an integer equal or greater than five; the amplifier arrangement comprising:

a cascade of quarter wavelength transmission lines coupled between an output of an amplifier of a first amplifier stage and an output node of the amplifier arrangement, wherein the cascade comprises N−1 quarter wavelength transmission lines;

wherein an amplifier of the Nth stage is coupled to the output node, and remaining amplifiers between the first and Nth stages coupled to successive junctions in the cascade of quarter wavelength transmission lines; and wherein the amplifier arrangement is further configured such that:

a first amplifier of the first stage is coupled directly to a first side of a first one of the cascade of quarter wavelength transmission lines and a second amplifier of a second stage is coupled directly to a second side of the first one of the cascade of quarter wavelength transmission lines and directly to a first side of a second one of the cascade of quarter wavelength transmission lines; and remaining amplifiers of the third to Nth stages are coupled to their respective junctions of the cascade of quarter wavelength transmission lines such that at least one amplifier of successive pairs of amplifiers is coupled via respective connecting quarter wavelength transmission lines to its respective junction and at least a second amplifier of the successive pairs of amplifiers is coupled directly to its respective junction.

2. An amplifier as claimed in claim 1, wherein the amplifier arrangement comprises an odd number of amplifier stages, and wherein the Nth amplifier stage is coupled directly to the output node.

3. An amplifier as claimed in claim 1, wherein the amplifier arrangement comprises an odd number of amplifier stages, and wherein the Nth amplifier stage is coupled via a connecting quarter wavelength transmission line to the output node.

4. An amplifier as claimed in claim 1, wherein the characteristic impedance of each successive stage in the cascade of quarter wavelength transmission lines is reduced towards the output node in relation to the parallel combination of preceding connecting transmission lines, whereby the characteristic impedance of each successive stage is reduced to 1/M of the impedance of the transmission line from a single amplifier, whereby M relates to the number of preceding amplifiers.

5. An amplifier as claimed in claim 1, wherein each of the amplifiers in the N amplifier stages is substantially equal in size.

6. An amplifier as claimed in claim 5, wherein the characteristic impedance of each of the connecting quarter wavelength transmission lines is substantially equal.

7. An amplifier as claimed in claim 1, wherein at least one amplifier of the amplifier arrangement is different in size to the other amplifiers of the amplifier arrangement.

8. An amplifier as claimed in claim 7, wherein a characteristic impedance of a corresponding quarter wavelength transmission line is different to the characteristic impedance of the quarter wavelength transmission lines associated with the other amplifiers of the amplifier arrangement.

9. An amplifier as claimed in claim 7, wherein one amplifier of an amplifier pair is reduced or increased in size compared to the other amplifier of the amplifier pair, and wherein a characteristic impedance of a corresponding quarter wavelength transmission line is increased or decreased, respectively, compared to the characteristic impedance of the quarter wavelength transmission line associated with the other amplifier in the amplifier pair.

10. An amplifier as claimed in claim 7, wherein first and second amplifiers of at least one amplifier pair are reduced or increased in size compared to the other amplifiers of the amplifier arrangement, and wherein a characteristic impedance of corresponding quarter wavelength transmission lines of the amplifier pair are increased or decreased, respectively, compared to the characteristic impedance of the quarter wavelength transmission lines associated with the other amplifiers in the amplifier arrangement.

11. An amplifier as claimed in claim 7, wherein the size of at least one amplifier is halved, and a characteristic impedance of at least one corresponding quarter wavelength transmission line is doubled.

12. A method of improving the efficiency of an amplifier arrangement comprising N amplifier stages, wherein N is an integer equal or greater than five; wherein the amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines, and wherein an amplifier of the Nth stage is coupled to the output node, and remaining amplifiers between the first and Nth stages coupled to successive junctions in the cascade of quarter wavelength transmission lines; the method comprising the steps of:
 directly coupling a first amplifier of the first stage to a first side of a first one of the cascade of quarter wavelength transmission lines;
 directly coupling a second amplifier of the second stage to a second side of the first one of the cascade of quarter wavelength transmission lines and to a first side of a second one of the cascade of quarter wavelength transmission lines; and
 coupling the remaining amplifiers to their respective junctions of the cascade of quarter wavelength transmission lines such that successive pairs of amplifiers are either coupled via respective connecting quarter wavelength transmission lines to their respective junctions, or coupled directly to their respective junctions.

13. A method as claimed in claim 12, wherein the amplifier arrangement comprises an odd number of amplifier stages, and wherein the method comprises the step of coupling the Nth amplifier stage directly to the output node.

14. A method as claimed in claim 12, wherein the amplifier arrangement comprises an odd number of amplifier stages, and wherein the method comprises the step of coupling the Nth amplifier stage ($10_N$) via a connecting quarter wavelength transmission line to the output node.

15. A method as claimed in claim 12, further comprising the step of reducing the characteristic impedance of each successive stage in the cascade of quarter wavelength transmission lines towards the output node in relation to the parallel combination of preceding connecting transmission lines, whereby the characteristic impedance of each successive stage is reduced to 1/M of the impedance of the transmission line from a single amplifier, whereby M relates to the number of preceding amplifiers.

16. A method as claimed in claim 12, further comprising the step of providing substantially equally sized amplifiers in each of the N amplifier stages.

17. A method as claimed in claim 16, further comprising the step of providing connecting quarter wavelength transmission lines of substantially equal characteristic impedance.

18. A method as claimed in claim 12, further comprising the step of increasing or decreasing the size of at least one amplifier of the amplifier arrangement compared to the other amplifiers of the amplifier arrangement, and decreasing or increasing, respectively, the characteristic impedance of a corresponding quarter wavelength transmission line compared to the characteristic impedance of the quarter wavelength transmission lines associated with the other amplifiers of the amplifier arrangement.

19. An amplifier arrangement comprising N amplifier stages, wherein N is an integer equal or greater than five; the amplifier arrangement comprising:
 a first amplifier directly coupled to a first quarter wavelength transmission line;
 a second amplifier directly coupled to the first quarter wavelength transmission line and to a second quarter wavelength transmission line;
 a third amplifier coupled to the second quarter wavelength transmission line and to a third quarter wavelength transmission line;
 a fourth amplifier coupled to the third quarter wavelength transmission line and to a fourth quarter wavelength transmission line;
 a fifth amplifier coupled to the fourth quarter wavelength transmission line,
 wherein at least one of the third, fourth, and fifth amplifiers is directly coupled to one of the third and fourth quarter wavelength transmission lines, and at least one of the third, fourth, and fifth amplifiers are indirectly coupled to one of the third and fourth quarter wavelength transmission lines via a connecting quarter wavelength transmission line.

20. An amplifier as claimed in claim 19, further comprising at least a sixth amplifier coupled to a fifth quarter wavelength transmission line, wherein
 the third amplifier is directly coupled to the third quarter wavelength transmission line, the fourth amplifier is directly coupled to the fourth quarter wavelength transmission line, the fifth amplifier is indirectly coupled to the fifth quarter wavelength transmission line via a first connecting quarter wavelength transmission line, and the sixth amplifier is indirectly coupled to the fifth quarter wavelength transmission line via a second connecting quarter wavelength transmission line, or
the third amplifier is indirectly coupled to the third quarter wavelength transmission line via a first connecting quarter wavelength transmission line, the fourth amplifier is directly coupled to the fourth quarter wavelength transmission line via a third connecting quarter wavelength transmission line, the fifth amplifier is directly coupled to the fifth quarter wavelength transmission line, and the sixth amplifier is directly coupled to the fifth quarter wavelength transmission line.

\* \* \* \* \*